United States Patent
Morimoto et al.

(10) Patent No.: US 8,704,226 B2
(45) Date of Patent: Apr. 22, 2014

(54) THREE-DIMENSIONAL INTEGRATED CIRCUIT HAVING REDUNDANT RELIEF STRUCTURE FOR CHIP BONDING SECTION

(75) Inventors: Takashi Morimoto, Osaka (JP); Takashi Hashimoto, Fukuoka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 13/812,011

(22) PCT Filed: Jan. 11, 2012

(86) PCT No.: PCT/JP2012/000123
§ 371 (c)(1),
(2), (4) Date: Jan. 24, 2013

(87) PCT Pub. No.: WO2012/140810
PCT Pub. Date: Oct. 18, 2012

(65) Prior Publication Data
US 2013/0127028 A1   May 23, 2013

(30) Foreign Application Priority Data

Apr. 13, 2011 (JP) .................................. 2011-089370

(51) Int. Cl.
*H01L 23/58* (2006.01)
(52) U.S. Cl.
USPC ..................................... 257/48; 257/E21.526
(58) Field of Classification Search
USPC ............................................ 257/48, E21.526
See application file for complete search history.

(56) References Cited

U.S. PATENT DOCUMENTS

| | | | |
|---|---|---|---|
| 5,753,536 A | 5/1998 | Sugiyama et al. | |
| 6,214,630 B1 * | 4/2001 | Hsuan et al. | 438/11 |
| 7,281,155 B1 | 10/2007 | Eto et al. | |
| 7,577,885 B2 * | 8/2009 | Hasegawa et al. | 714/718 |
| 2003/0202388 A1 * | 10/2003 | Koretsky | 365/200 |

(Continued)

FOREIGN PATENT DOCUMENTS

| | | |
|---|---|---|
| JP | 8-125121 | 5/1996 |
| JP | 2001-6389 | 1/2001 |

(Continued)

OTHER PUBLICATIONS

International Search Report issued Feb. 7, 2012 in corresponding International Application No. PCT/JP2012/000123.
Nobuaki Miyakawa et al., "Three-Dimensional Stacking Process Technology: Verification and Future Questions", Honda Research Institute, vol. 2011-ARC-193, No. 5, Jan. 20, 2011 (with partial English translation).

*Primary Examiner* — Thanh V Pham
(74) *Attorney, Agent, or Firm* — Wenderoth, Lind & Ponack, L.L.P.

(57) ABSTRACT

A chip is layered on a rewiring member. A plurality of connecting members and a plurality of redundant connecting members are arranged in the chip, and electrically connect the chip to the rewiring member. Redundant circuits are embedded in each of the rewiring member and the chip. When one of the connecting members is faulty, the redundant circuits cause one of the redundant connecting members to transmit a signal between the rewiring member and the chip, instead of the faulty connecting member. The connecting members have first and second subsets arranged in first and second regions, respectively. A distance between the rewiring member and the chip exceeds a predetermined threshold value in the first region in contrast to the second region. The first subset has a higher proportion of connecting members that the redundant circuits can replace with a subset of the redundant connecting members than the second subset.

7 Claims, 17 Drawing Sheets

(56) References Cited

U.S. PATENT DOCUMENTS

| | | |
|---|---|---|
| 2005/0007143 A1 | 1/2005 | Ishigaki |
| 2006/0001176 A1* | 1/2006 | Fukaishi et al. ............. 257/777 |
| 2006/0163689 A1 | 7/2006 | Seo |
| 2007/0132085 A1 | 6/2007 | Shibata et al. |
| 2009/0057890 A1 | 3/2009 | Maebashi et al. |
| 2010/0060310 A1* | 3/2010 | Laisne et al. .................... 326/10 |
| 2010/0285654 A1 | 11/2010 | Seo |

FOREIGN PATENT DOCUMENTS

| | | |
|---|---|---|
| JP | 2003-309183 | 10/2003 |
| JP | 2006-19328 | 1/2006 |
| JP | 2006-196899 | 7/2006 |
| JP | 2007-158237 | 6/2007 |
| JP | 2009-55007 | 3/2009 |

* cited by examiner

FIG.8

| Transmitter selectors | | Receiver selectors | | | Transmitted test bit sequence | Received test bit sequence | Test result |
| --- | --- | --- | --- | --- | --- | --- | --- |
| I | II | A | B | C | | | |
| dbus[1] | dbus[2] | TSV1 | TSV2 | TSV3 | 11111 | 11111 | Normal |
| dbus[1] | dbus[2] | TSV1 | TSV2 | TSV3 | 00000 | 00100 | TSV2 is faulty |
| dbus[1] | dbus[2] | TSV1 | RTSV1 | TSV3 | 11111 | 11111 | Normal |
| dbus[1] | dbus[2] | TSV1 | RTSV1 | TSV3 | 00000 | 00100 | RTSV1 is faulty |
| dbus[2] | dbus[2] | TSV1 | RTSV2 | TSV3 | 11111 | 11111 | Normal |
| dbus[2] | dbus[2] | TSV1 | RTSV2 | TSV3 | 00000 | 00000 | Normal |

THREE-DIMENSIONAL INTEGRATED CIRCUIT HAVING REDUNDANT RELIEF STRUCTURE FOR CHIP BONDING SECTION

TECHNICAL FIELD

The present invention relates to three-dimensional layering technologies for integrated circuits, and in particular to a technology for relieving interchip communication of connection failures.

BACKGROUND ART

A plurality of chips that are layered one on top of the other and electrically connected to each other through connecting members such as through silicon vias (TSV) or micro bumps is referred to as "three-dimensional integrated circuit." In a three-dimensional integrated circuit, each connecting member has a diameter within the range from several μm to several tens of μm, and occupies a tiny area of a chip. Accordingly, connecting members may be greater in number than external pins of the chip, and in particular, can be distributed throughout the chip.

In the manufacturing process of three-dimensional integrated circuits, the thickness of each chip is reduced by a polishing process such as Chemical Mechanical Polish (CMP). As the result of the polishing process, some chips will be as thin as several μm. The reason for making chips thin is as follows. In the case where connecting members are TSVs, the depth of each TSV becomes smaller with a reduced thickness of a chip. This reduces a time period required for forming the TSVs. As a result, the manufacturing cost of the chip is reduced. In addition, a three-dimensional integrated circuit (chip package) that is to be mounted on a mobile phone and the like requires a layered structure of a plurality of chips, but on the other hand, is subject to a restriction on the thickness of its entire package. Therefore, the thickness of each chip has to be small to reduce the thickness of the entire package.

Chips with a reduced thickness warp. For example, Patent Literature 1 discloses that thinner chips more greatly warp. Further, Non-Patent Literature 1 discloses experimental data on warpage of a silicon wafer. Warpage of chips leads to the following problems. During manufacture of three-dimensional integrated circuits, chips are separately manufactured and bonded to each other by adhesive layers or the likes. If the chips warped at the time of bonding, increase of the distances between the chips might cause a defect to occur in a connecting member. The probability of occurrence of a defect in a connecting member is not negligible in the first place since the structure of each connecting member is fine and minute, and in addition the number of connecting members is very large. If the chips were designed without considering possible occurrence of a faulty connection, a chip that would happen to have a faulty connection would have to be discarded as a defective product. That is, the yield of chips would decrease by the probability of occurrence of a faulty connection. As a result, it is difficult to further reduce the manufacturing cost of the chips.

As a technology for preventing a decrease in the yield of circuitry caused by connection failures in wiring, a redundant technology is known (see Patent Literature 2, for example). "Redundant technology" is a technology for preparing a redundant circuit such as a wire and a cell embedded in circuitry and, when a wire or cell of the circuitry is defective, using the redundant circuit instead of the defective wire or cell. In a semiconductor memory device disclosed in Patent Literature 2, redundant selection wires are prepared in addition to selection wires of memory cells. Further, switches are located between the selection wires and external signal lines. The switches connect the redundant selection wires, instead of the selection wires, to the external signal lines. With this structure, when any of the selection wires is defective, one of the redundant selection wires is connected to the external signal lines, instead of the defective selection wire. As a result, the semiconductor memory device need not to be discarded in more cases even when any of the selection wires is defective, and accordingly, the yield of semiconductor memory devices avoids decreases caused by defective selection wires.

CITATION LIST

Patent Literature

[Patent Literature 1]
Japanese Patent Application Publication No. 2006-196899
[Patent Literature 2]
Japanese Patent Application Publication No. 2001-6389

Non-Patent Literature

[Non-Patent Literature 1]
Nobuaki Miyagawa, "San-Jigen Sekisou Purosesu Gijutsu No Kensho Kekka To Kongo No Kadai," (in Japanese), IPSJ SIG Technical Report, 2011-ARC-193 No. 5 (2011)

SUMMARY OF INVENTION

Technical Problem

Application of a redundant technology to three-dimensional integrated circuits first adds redundant connecting members to connecting members between chips. The application next locates selectors between the connecting members and buses in the chips. The selectors can connect the redundant connecting members to the buses instead of the connecting members. Further, a control circuit for controlling the selectors is embedded in each chip. A combination of the selectors and the control circuit is referred to as "redundant circuit." When a connecting member is faulty, the redundant circuit controls a selector connected to the faulty connecting member such that a redundant connecting member is connected to the bus of each chip instead of the faulty connecting member. This structure maintains excellent electrical connection among the chips.

Thus, redundant circuits operate only when a connecting member is faulty. Accordingly, in order to prevent the redundant circuits from affecting power consumption and normal operation of each chip, it is preferable that the areas of the redundant circuits be as small as possible. Such minimization of areas of the redundant circuits is also desirable to further reduce the manufacturing cost of each chip. In conventional redundant circuits, however, all connecting members are connected to respective selectors. Therefore, it is difficult to further reduce the area of the entire redundant circuit, which includes wires connecting the connecting members and the selectors and wires connecting the selectors and the control circuit. It is also difficult to further reduce power consumption during operation of the selectors.

An aim of the present invention is to solve the above-described problems, and in particular to provide a three-dimensional integrated circuit enabling redundant circuits not only to prevent decreases in the yield of three-dimensional integrated circuits caused by faulty connections among chips, but also to have further reduced areas.

Solution to Problem

A three-dimensional integrated circuit according to the present invention includes a rewiring member, a chip, a plurality of connecting members, a plurality of redundant connecting members, and first and second redundant circuits. The rewiring member is plate-like, and the chip is layered on the rewiring member. The rewiring member may be another chip or an interposer. When the rewiring member is another chip, the rewiring member may include both a transistor layer and a wiring layer, or may include only a wiring layer. The connecting members and the redundant connecting members are arranged in the chip and electrically connect the chip to the rewiring member. The first and second redundant circuits are embedded in the rewiring member and the chip, respectively. When one of the connecting members is faulty, each of the redundant circuits cause one of the redundant connecting members, instead of the faulty one of the connecting members, to transmit a signal between the rewiring member and the chip. The connecting members include first and second subsets that are arranged in first and second regions, respectively. A distance between the rewiring member and the chip exceeds a predetermined threshold value in the first region in contrast to the second region. The first subset has a higher proportion of connecting members that the first and second redundant circuits can replace with a subset of the redundant connecting members than second subset.

Advantageous Effects of Invention

The three-dimensional integrated circuit according to the present invention is characterized in that the subset of the connecting members arranged in the region where the distance between the rewiring member and the chip is relatively large has a higher proportion of connecting members replaceable with a subset of the redundant connecting members. As a result, the three-dimensional integrated circuit enables the redundant circuits not only to prevent decreases in the yield of three-dimensional integrated circuits caused by faulty connections among chips, but also to have further reduced areas.

BRIEF DESCRIPTION OF DRAWINGS

FIG. 8 is a table illustrating a correspondence relationship among values provided to selectors, test bit sequences, and test results; this relationship is obtained from the tests performed by the test control apparatus TCL;

DESCRIPTION OF EMBODIMENTS

Preferred embodiments of the present invention are described below with reference to the drawings.

Embodiment 1

Figure 1:
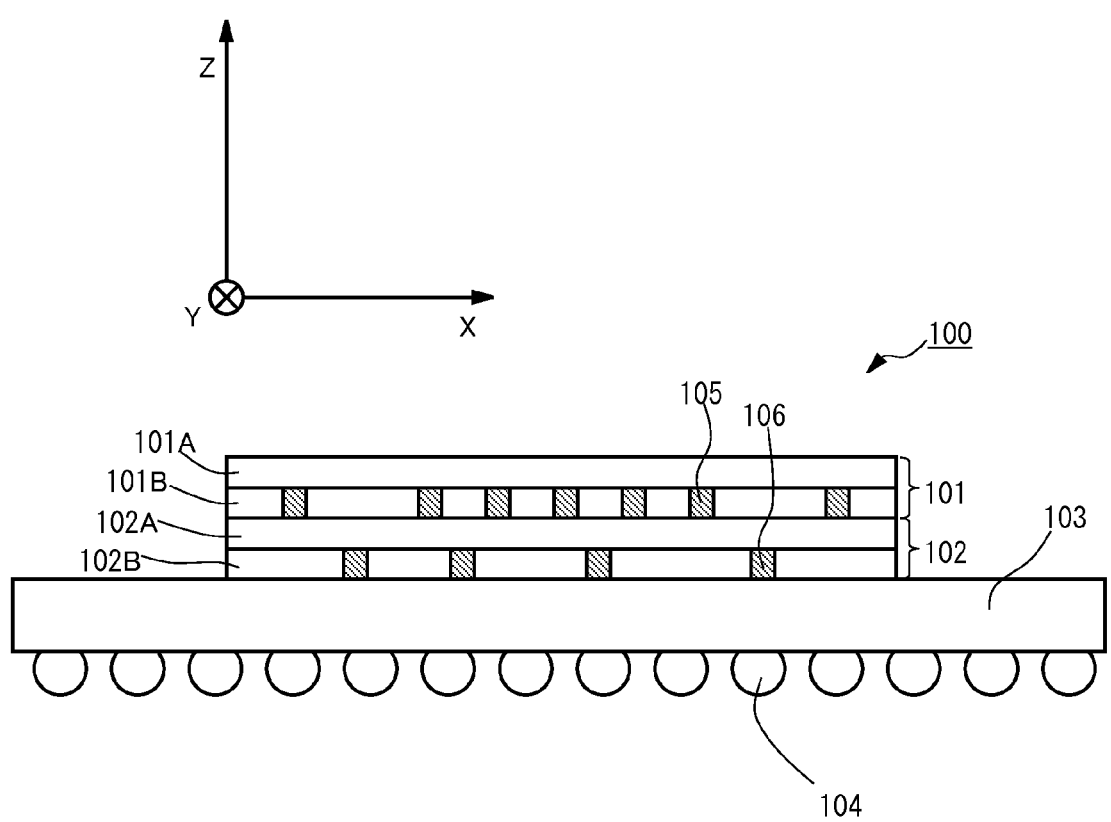
FIG. 1 is a schematic view showing a cross section of a three-dimensional integrated circuit 100 according to Embodiment 1 of the present invention.

FIG. 1 is a schematic view showing a cross section of a three-dimensional integrated circuit 100 according to Embodiment 1 of the present invention. With reference to FIG. 1, the three-dimensional integrated circuit 100 includes a first chip 101, a second chip 102, an interposer 103, and bumps 104.

Each of the first chip 101 and the second chip 102 is a rectangular-plate-like member made of silicon. The first chip 101 and the second chip 102 are the same in shape and size. The first chip 101 includes a wiring layer 101A and a transistor layer 101B, and the second chip 102 includes a wiring layer 102A and a transistor layer 102B. The transistor layers 101B and 102B include a plurality of transistors. These transistors are connected to one another through the wiring layers 101A and 102A to constitute various circuits (cores). The transistor layer 101B of the first chip 101 and the wiring layer 102A of the second chip 102 are bonded to each other by an adhesive layer. As shown in FIG. 1, the two chips 101 and 102 are layered such that each edge of the first chip 101 is located directly above a corresponding edge of the second chip 102. The transistor layer 102B of the second chip 102 and a surface (in FIG. 1, an upper surface) of the interposer 103 are bonded to each other by an adhesive layer.

The three-dimensional integrated circuit 100 according to Embodiment 1 is composed of the two chips 101 and 102. Alternatively, the three-dimensional integrated circuit may be composed of three or more chips. Further, the wiring layer 101A of the first chip 101 may be bonded to the wiring layer 102A of the second chip 102.

The transistor layers 101B and 102B of the chips 101 and 102 contain through-silicon vias (TSVs) 105 and 106. The TSVs 105 and 106 are each a conductive member made of copper, etc., and pass through the respective chips 101 and 102 in the normal directions of their surfaces (in FIG. 1, in the Z direction). The diameter and length of each of the TSVs 105 and 106 are within the range from several μm to several tens of μm. The wiring layer 101A of the first chip 101 is electrically connected to the wiring layer 102A of the second chip 102 through the TSVs 105. Accordingly, cores of the first chip 101 can exchange signals with cores of the second chip 102. The wiring layer 102A of the second chip 102 is electrically connected to wires implemented on the surface of the interposer 103 through the TSVs 106.

The interposer 103 is a chip made of silicon or a substrate made of polyimide, and includes wires implemented on its surface (in FIG. 1, the upper surface). The interposer 103 further includes through holes, but not shown in FIG. 1. Via these through holes, the wires implemented on the surface are electrically connected to the bumps 104 bonded to another surface (in FIG. 1, a lower surface). The bumps 104 are round solder balls, and connected to pins mounted on an external package. As a result, cores of the chips 101 and 102 can exchange signals with external apparatuses through the TSVs 105 and 106, the wires on the interposer 103 and the bumps 104.

Figure 2:
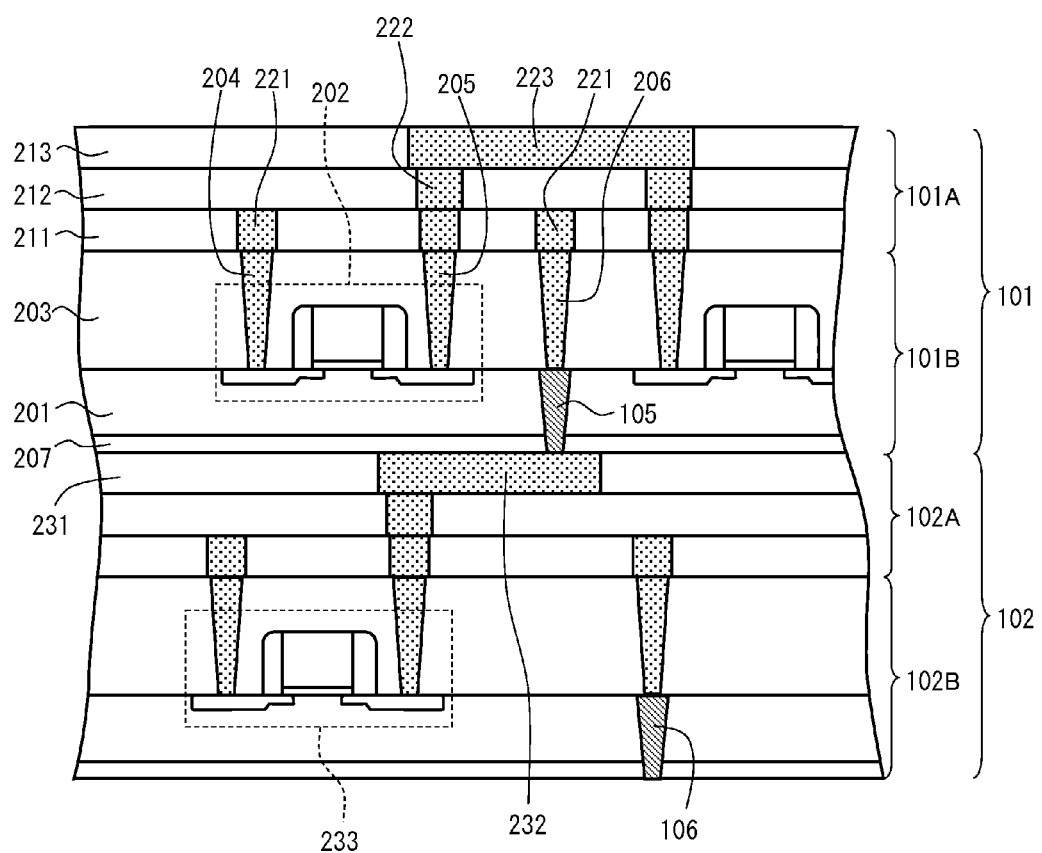
FIG. 2 is an enlarged cross-sectional view showing details of the vicinity of TSVs 105 and 106 shown in FIG. 1.

FIG. 2 is an enlarged cross-sectional view showing details of the vicinity of the TSVs 105 and 106 shown in FIG. 1. With reference to FIG. 2, the transistor layer 101B of the first chip 101 includes a substrate 201, a transistor 202, a first insulation film 203, contact holes 204, 205 and 206, the TSV 105 and a second insulation film 207. The substrate 201 is made of silicon (Si). The transistor 202 is formed on a surface (in FIG. 2, an upper surface) of the substrate 201. The insulation films 203 and 207 are made of silicon oxide, etc. The first insulation film 203 covers the surface of the substrate 201 and the entirety of the transistor 202. The second insulation film 207 covers the entirety of another surface (in FIG. 2, a lower surface) of the substrate 201. The first contact hole 204 and the second contact hole 205 are connected to respective diffusion areas 202A and 202B of the transistor 202. The third contact hole 206 is connected to the TSV 105. The contact holes 204-206 are made of aluminum, tungsten, copper or the like. The TSV 105 passes through the substrate 201 and the second insulation film 207. While not shown in FIG. 2, a thin insulation film and a barrier layer are formed between the TSV 105 and the substrate 201. The thin insulation film is made of silicon oxide. The barrier layer prevents the substrate 201 from being contaminated with metal.

With reference to FIG. 2, the wiring layer 101A of the first chip 101 includes three interlayer insulation films 211, 212 and 213 and three kinds of wires 221, 222 and 223. The interlayer films 211-213 are made of silicon oxide or low-k material. The wires 221-223 are made of aluminum or copper. The first interlayer insulation film 211 covers the entirety of the transistor layer 101B. The first wires 221 are formed within the first interlayer insulation film 211, and connected to the contact holes 204-206. The second interlayer insulation film 212 covers the entirety of the first interlayer insulation film 211. The second wires 222 are formed within the second interlayer insulation film 212, and connected to part of the first wires 221. The third interlayer insulation film 213 covers the entirety of the second interlayer insulation film 212. The third wire 223 is formed within the third interlayer insulation film 213, and interconnects the second wires 222. The first wires 221, the second wires 222, and the third wire 223 connect the transistor 202 to another transistor or the TSV 105.

As shown in FIG. 2, the second chip 102 has the same structure as the first chip 101. The TSV 105 is connected to a wire 232 formed within the uppermost interlayer insulation film 231, shown in FIG. 2, in the wiring layer 102A of the second chip 102. Such a structure allows the transistor 202 in the first chip 101 to be connected to a transistor 233 in the second chip 102 through the TSV 105.

The thickness of the substrate 201 shown in FIG. 2 is within the range from several μm to several tens of μm. Since the length of the TSV 105 is substantially the same as the thickness of the substrate 201 in this case, a time period required for forming the TSV 105 is short. Also, the substrate of the second chip 102 has almost the same thickness as the substrate 201 of the first chip 101, and accordingly, the entirety of the first chip 101 and the second chip 102 is thin. However, the thin substrate 201 causes warpage of the first chip 101. The second chip 102 similarly warps. The degree of warpage varies with the following factors: material of layers constituting the chips 101 and 102; coefficients of thermal expansions of the chips 101 and 102; structures of circuitry implemented on the chips 101 and 102; and differences in temperature among the layers.

Figure 3A:
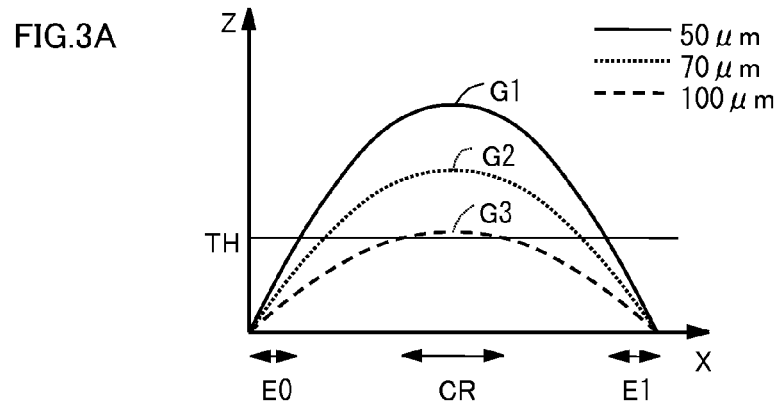
FIG. 3A is a graph showing the distances between a first chip 101 and a second chip 102 according to Embodiment 1 of the present invention varying with longitudinal location caused by warpage of the chips.

FIG. 3A is a graph showing the distances between the first chip 101 and the second chip 102 varying with longitudinal location caused by warpage of the chips. The X axis is oriented in the longitudinal direction of the first chip 101, like the X axis shown in FIG. 1. The Z axis is oriented in the normal direction of the surface of the first chip 101, like the Z axis shown in FIG. 1. In particular, as shown in FIG. 1, the positive direction of the Z axis points away from the interposer 103. The graph of FIG. 3A shows a solid line G1, dotted line G2 and dashed line G3 indicating the distances between the chips 101 and 102 with the thickness of 50, 70 and 100 μm, respectively. As shown by these lines, the distances between the chips are large in the central region CR of the chips, and small in peripheral regions E0 and E1 thereof. Further, the thinner the chips are, the more greatly the distances therebetween vary. The greater the distances are, the more vulnerable to faults the TSVs 105 are. Accordingly, the TSVs 105 are more vulnerable to faults in the central region CR than in the peripheral regions E0 and E1.

Figure 3B:
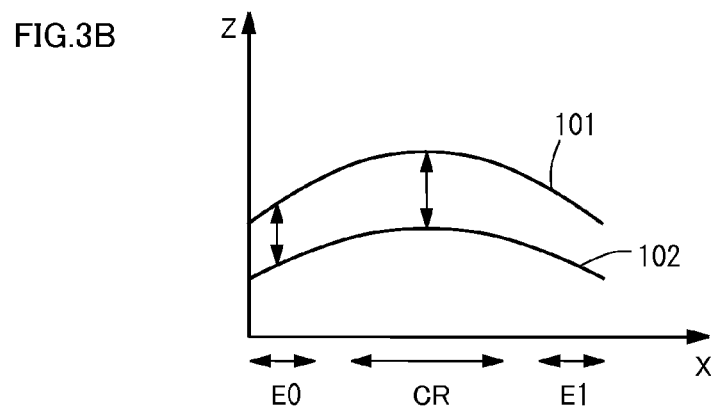
FIG. 3B is a schematic view showing one example of actual warpage of the first chip 101 and the second chip 102.

FIG. 3B is a schematic view showing one example of actual warpage of the first chip 101 and the second chip 102. The X and Z axes in FIG. 3B are the same as the axes in FIG. 3A. With reference to FIG. 3B, the first chip 101 and the second chip 102 warp such that their central region CR is farther from the interposer 103 than their peripheral regions E0 and E1. The curvature of the warpage of the first chip 101 is greater than that of the second chip 102. As a result, the distances between the first chip 101 and the second chip 102 vary as shown in the graph of FIG. 3A, and are specifically greater in the central region CR than in the peripheral regions E0 and E1. Meanwhile, a TSV is more vulnerable to faults with increase in the distances between the first chip 101 and the second chip 102. Accordingly, in the case shown in FIG. 3B, a faulty TSV is more likely to appear in the central region CR than in the peripheral regions E0 and E1.

Figure 3C:
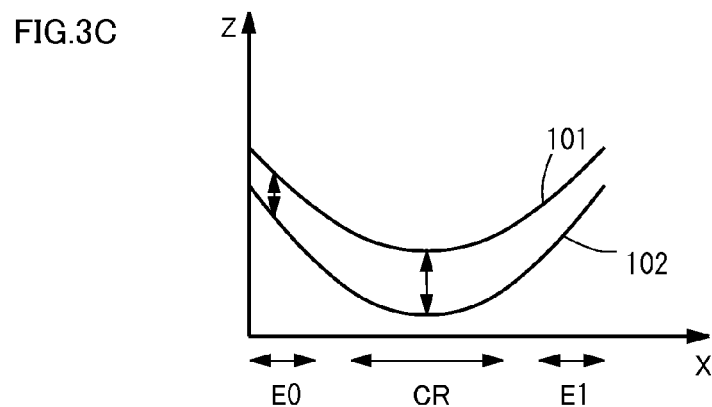
FIG. 3C is a schematic view showing another example of actual warpage of the first chip 101 and the second chip 102.

While the distances between the chips 101 and 102 vary as shown in FIG. 3A, the direction of warpage of the chips may be opposite to the direction of the warpage shown in FIG. 3B. FIG. 3C is a schematic view showing another example of actual warpage of the first chip 101 and the second chip 102. The X and Z axes in FIG. 3C are the same as the axes in FIG. 3A. With reference to FIG. 3C, the first chip 101 and the second chip 102 warp such that their peripheral regions E0 and E1 are farther from the interposer 103 than their central region CR. The curvature of the warpage of the second chip 102 is greater than that of the first chip 101. As a result, the distances between the first chip 101 and the second chip 102 vary as shown in the graph of FIG. 3A, and are specifically greater in the central region CR than in the peripheral regions E0 and E1. Accordingly, also in the case shown in FIG. 3C, a faulty TSV is more likely to appear in the central region CR than in the peripheral regions E0 and E1.

Figure 3D:
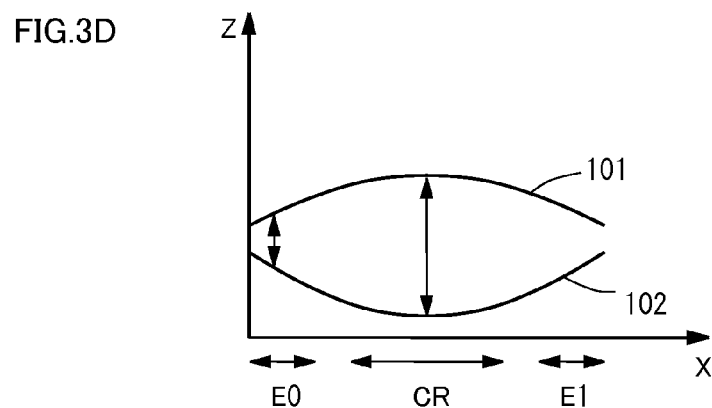
FIG. 3D is a schematic view showing yet another example of actual warpage of the first chip 101 and the second chip 102.

FIG. 3D is a schematic view showing yet another example of actual warpage of the first chip 101 and the second chip 102. The X and Z axes in FIG. 3D are the same as the axes in FIG. 3A. With reference to FIG. 3D, the first chip 101 warps such that its central region CR is farther from the interposer 103 than its peripheral regions E0 and E1, but the second chip 102 warps such that its peripheral regions E0 and E1 are farther from the interposer 103 than its central region CR. As a result, the distances between the first chip 101 and the second chip 102 vary as shown in the graph of FIG. 3A, and are specifically greater in their central region CR than in their peripheral regions E0 and E1. Accordingly, even in the case shown in FIG. 3D, a faulty TSV is more likely to appear in the central region CR than in the peripheral regions E0 and E1.

Figure 4:
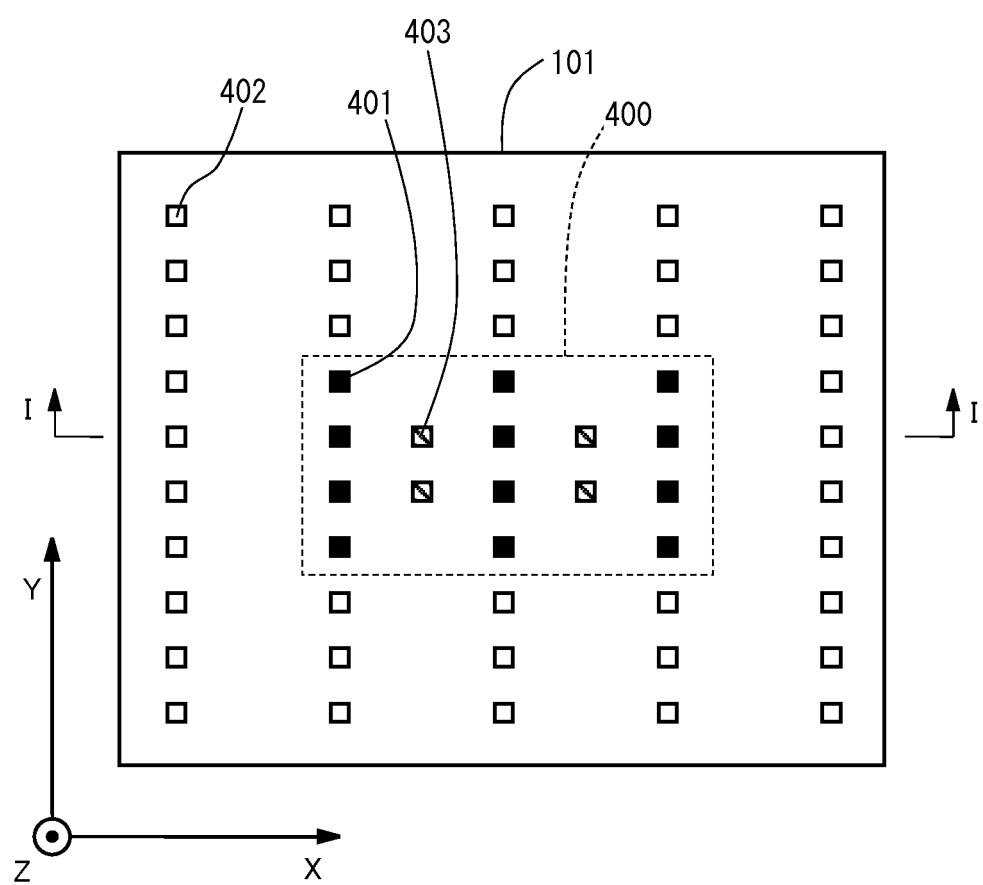
FIG. 4 is a plan view schematically showing an arrangement of TSVs 401, 402 and 403 on the first chip 101 according to Embodiment 1 of the present invention.

FIG. 4 is a plan view schematically showing an arrangement of TSVs 401, 402 and 403 on the first chip 101. Each edge of the chip is several mm long while the diameter of each of the TSVs 401, 402 and 403 is within the range from several μm to several tens of μm. This means that, in FIG. 4, the diameters of the TSVs 401, 402 and 403 are exaggerated. With reference to FIG. 4, the TSVs are classified into first TSVs 401, second TSVs 402, and redundant TSVs 403. The first TSVs 401 and the second TSVs 402 are located at intervals of predetermined lengths, e.g., several hundred μm, in both longitudinal and transverse directions of the first chip 101 (the X- and Y-axis directions in FIG. 2, respectively). In FIG. 4, the first TSVs 401 are shown as black rectangles, and arranged in the central region 400 of the first chip 101. In FIG. 4, the second TSVs 402 are shown as white rectangles, and arranged in the periphery of the central region 400. In FIG. 4, the redundant TSVs 403 are shown as hatched rectangles, and arranged among the first TSVs 401. While not shown in FIG. 4, various cores and selectors are implemented in regions among the TSVs 401, 402 and 403. The selectors each select either one of the first TSVs 401 or one of the redundant TSVs 403, and electrically connect the selected TSV to the wiring layer 101A of the first chip 101. This allows the cores of the first chip 101 to be electrically connected to the cores of the second chip 102 through the first TSVs 401 or the redundant TSVs 403. In contrast, the second TSVs 402 electrically connect the wiring layer 101A of the first chip 101 directly to the wiring layer 101B of the second chip 102.

When one of the first TSVs 401 is faulty, one of the selectors that is connected to the faulty first TSV 401 connects, instead of the faulty first TSV 401, one of the redundant TSVs 403 to the wiring layers 101A and 102A of the chips. This structure maintains excellent electrical connection between the first chip 101 and the second chip 102.

The central region 400 in which the first TSVs 401 are arranged as shown in FIG. 4 is assigned to the region where the distances between the chips exceed a predetermined threshold value TH as shown in FIG. 3A. The threshold value TH equals the distances between the chips in the case where the probability of appearance of a faulty TSV due to the warpage of the chips reaches a predetermined value. In the central region 400, the distances between the chips exceed the threshold value TH, and accordingly the probability of appearance of a faulty TSV exceeds the predetermined value. Thus, the placement of the first TSVs 401 is limited within the range in which TSVs are vulnerable to faults due to the large distances between the chips. This structure limits the number of the selectors, the areas of wires connecting the first TSVs 401 to the selectors, and the areas of wires connecting the selectors to the control circuit thereof.

Figure 5:
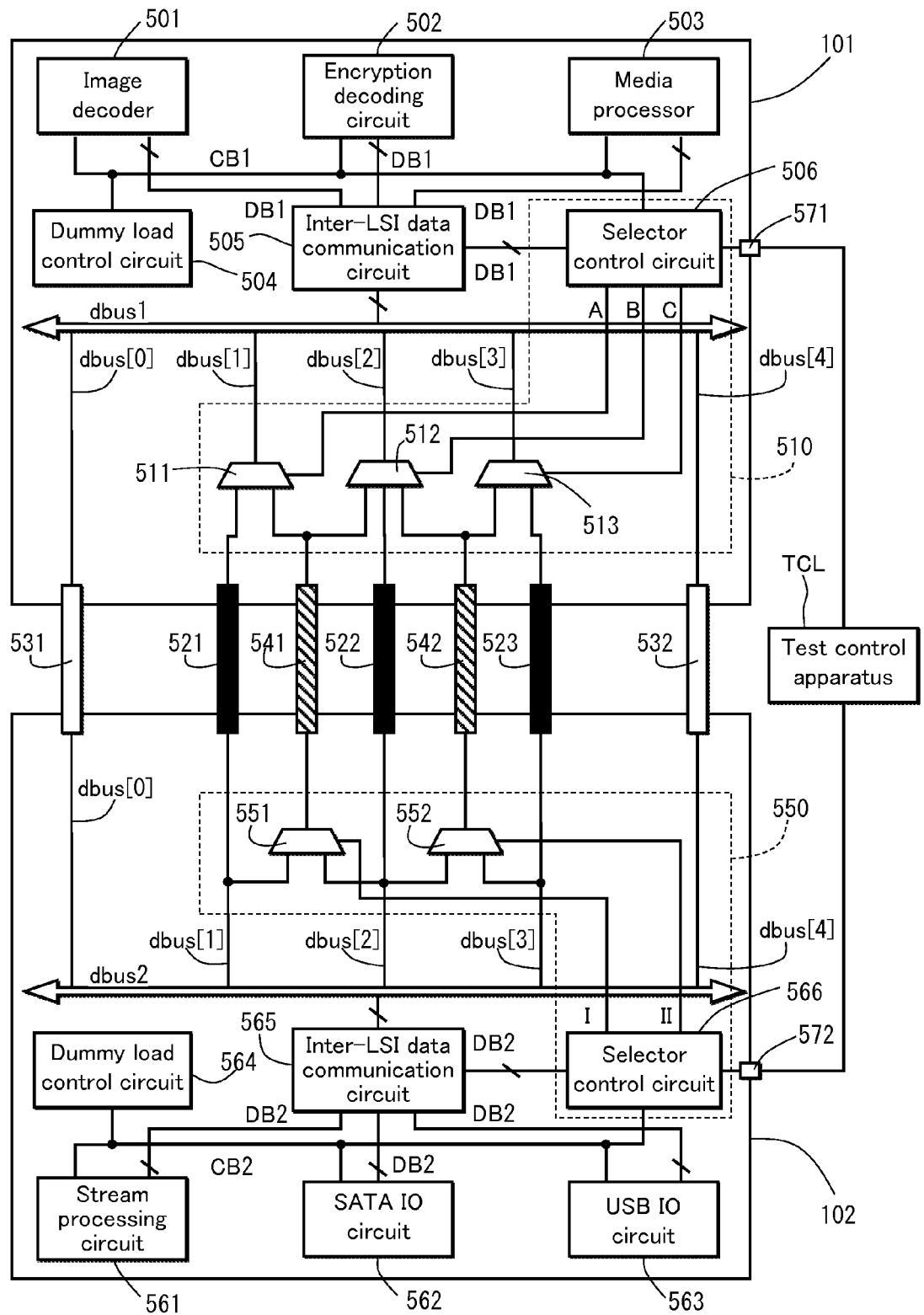
FIG. 5 is a block diagram showing one example of circuits implemented on the first chip 101 and the second chip 102.

FIG. 5 is a block diagram showing one example of circuits implemented on the first chip 101 and the second chip 102. With reference to FIG. 5, the first chip 101 includes, as cores, an image decoder 501, an encrypting/decrypting circuit 502, a media processor 503, a dummy load control circuit 504, an inter-LSI data communication circuit 505 and a selector control circuit 506. Additionally, the first chip 101 includes selectors 511, 512 and 513, a command bus CB1, data buses DB1 and a common bus dbus1.

The image decoder 501 restores video data from stream data. The encrypting/decrypting circuit 502 decrypts encrypted stream data. The media processor 503, which is referred to also as a digital signal processor (DSP), operates various image processing on video data. The inter-LSI data communication circuit 505 is connected individually to the image decoder 501, the encrypting/decrypting circuit 502, the media processor 503 and the selector control circuit 506 through the data buses DB1, and relays signals between two of them or between one of them and the common bus dbus1.

The common bus dbus1 connects the inter-LSI data communication circuit 505 and each of TSVs 521, 522, 523, 531, 532, 541 and 542 directly or through the selectors 511, 512 and 513, and relays signals among them. In the common bus dbus1, a first bit line dbus[0] is connected to one of the second TSVs (TSV 531), a second bit line dbus[1] is connected to a first selector 511, a third bit line dbus[2] is connected to a second selector 512, a fourth bit line dbus[3] is connected to a third selector 513, and a fifth bit line dbus[4] is connected to another one of the second TSVs (TSV 532). The first selector 511 selects either one of the first TSVs (TSV1 521) or one of the redundant TSVs (RTSV1 541), and connects the selected TSV to the second bit line dbus[1]. The second selector 512 selects either one of the redundant TSVs (RTSV1 541 and RTSV2 542) or one of the first TSVs (TSV2 522), and connects the selected TSV to the third bit line dbus[2]. The third selector 513 selects either the RTSV2 542 or one of the first TSVs (TSV3 523), and connects the selected TSV to the fourth bit line dbus[3].

The dummy load control circuit 504 is connected to the image decoder 501, the encrypting/decrypting circuit 502, the media processor 503 and the selector control circuit 506 through the command bus CB1 to transmit a dummy command to them. The dummy command is used for instructing the cores 501-503 to execute their respective test operations. In response to the dummy command, the selector control circuit 506 transmits test data to the cores 501-503 via the data buses DB1 and the inter-LSI data communication circuit 505. Each of the cores 501-503 processes the test data in response to the dummy command.

The selector control circuit 506 is connected to the selectors 511, 512 and 513 through signal lines A, B and C, respectively, to constitute a redundant circuit 510 of the first chip 101 along with the selectors 511-513. The selector control circuit 506 specifies a TSV to be selected to each of the selectors 511-513 via a corresponding one of the signal lines A, B and C. Further, the selector control circuit 506 receives a test bit sequence from the second chip 102 through the TSVs 521, 522, 523, 531, 532, 541 and 542, the selectors 511-513, the common bus dbus1 and the inter-LSI data communication circuit 505 while the cores 501-503 execute their respective test operations. Each bit of the test bit sequence is received from a different TSV. The received test bit sequence is output through a first external pin 571.

With further reference to FIG. 5, the second chip 102 includes, as cores, a stream processing circuit 561, a serial ATA (SATA: Serial Advanced Technology Attachment) interface circuit (IO) 562, a Universal Serial Bus (USB) 10 563, a dummy load control circuit 564, an inter-LSI data communication circuit 565, and a selector control circuit 566. Additionally, the second chip 102 includes selectors 551 and 552, a command bus CB2, data buses DB2 and a common bus dbus2.

The SATA IO 562 transmits/receives data by following the SATA scheme. The USB IO 563 transmits/receives data by following the USB scheme. The stream processing circuit 561 separates stream data from data received individually by the SATA IO 562 and USB IO 563. The inter-LSI data communication circuit 565 is connected individually to the stream processing circuit 561, the SATA IO 562, the USB IO 563 and the selector control circuit 566 through the data buses DB2, and relays signals between two of them or between one of them and the common bus dbus2.

The common bus dbus2 connects the inter-LSI data communication circuit 565 and each of the TSVs 521, 522, 523, 531, 532, 541 and 542 directly or through the selectors 551 and 552, and relays signals among them. In the common bus dbus2, a first bit line dbus[0] is connected to one 531 of the second TSVs; a second bit line dbus[1] is connected to the TSV1 521 and the fourth selector 551; a third bit line dbus[2] is connected to the fourth selector 551, the TSV2 522 and the fifth selector 552; a fourth bit line dbus[3] is connected to the fifth selector 552 and the TSV3 523; and a fifth bit line dbus[4] is connected to another one 532 of the second TSVs. The fourth selector 551 selects either the second bit line dbus[1] or the third bit line dbus[2], and connects the selected line to the RTSV1 541. The fifth selector 552 selects either the third bit line dbus[2] or the fourth bit line dbus[3], and connects the selected line to the RTSV2 542.

The dummy load control circuit 564 is connected to the stream processing circuit 561, the SATA IO 562, the USB IO 563 and the selector control circuit 566 through the command bus CB2, and transmits a dummy command to them. The dummy command is for instructing the cores 561-563 and 566 to execute their respective test operations. In response to the dummy command, the selector control circuit 566 transmits test data to the cores 561-563 via the data buses DB2 and the inter-LSI data communication circuit 565. Each of the cores 561-563 processes the test data in response to the dummy command.

The selector control circuit 566 is connected to the selectors 551 and 552 through signal lines I and II, respectively, to constitute a redundant circuit 550 of the second chip 102 along with the selectors 551 and 552. The selector control circuit 566 specifies a TSV to be selected to each of the selectors 551 and 552 through a corresponding one of the signal lines I and II. Further, the selector control circuit 566 transmits a test bit sequence to the first chip 101 through the inter-LSI data communication circuit 565, the common bus dbus2, the selectors 551 and 552, the TSVs 521, 522, 523, 531, 532, 541 and 542 while the cores 561-563 execute their respective test operations. Each bit of the test bit sequence is transmitted to a different TSV. The transmitted test bit sequence is also output from a second external pin 572.

The manufacturing process of the three-dimensional integrated circuit 100 shown in FIG. 1 includes a test for checking whether the TSVs connecting the first chip 101 and the second chip 102 have any faults or not. During the test, a test control apparatus TCL is connected between the first external pin 571 and the second external pin 572, as shown in FIG. 5. The test control apparatus TCL checks whether a faulty TSV exists or not by using the selector control circuits 506 and 566 of the chips 101 and 102 in the following manner. Firstly, the test control apparatus TCL causes the selector control circuit 566 of the second chip 102 to transmit a test bit sequence, and causes the selector control circuit 506 of the first chip 101 to receive the test bit sequence. Secondly, the test control apparatus TCL reads from the second external pin 572 the test bit sequence that is transmitted from the selector control circuit 566 of the second chip 102, and reads from the first external pin 571 the test bit sequence that has been received by the selector control circuit 506 of the first chip 101. Thirdly, the test control apparatus TCL compares the latter test bit sequence with the former one to detect a mismatching bit. The appearance of the mismatching bit indicates that the TSV transmitting it is faulty. The test control apparatus TCL identifies the faulty TSV from the position of the mismatching bit, and causes the selector control circuits 506 and 566 to set up the selectors 511-513, 551 and 552 such that a redundant TSV transmits a signal instead of the faulty TSV.

Figure 6:
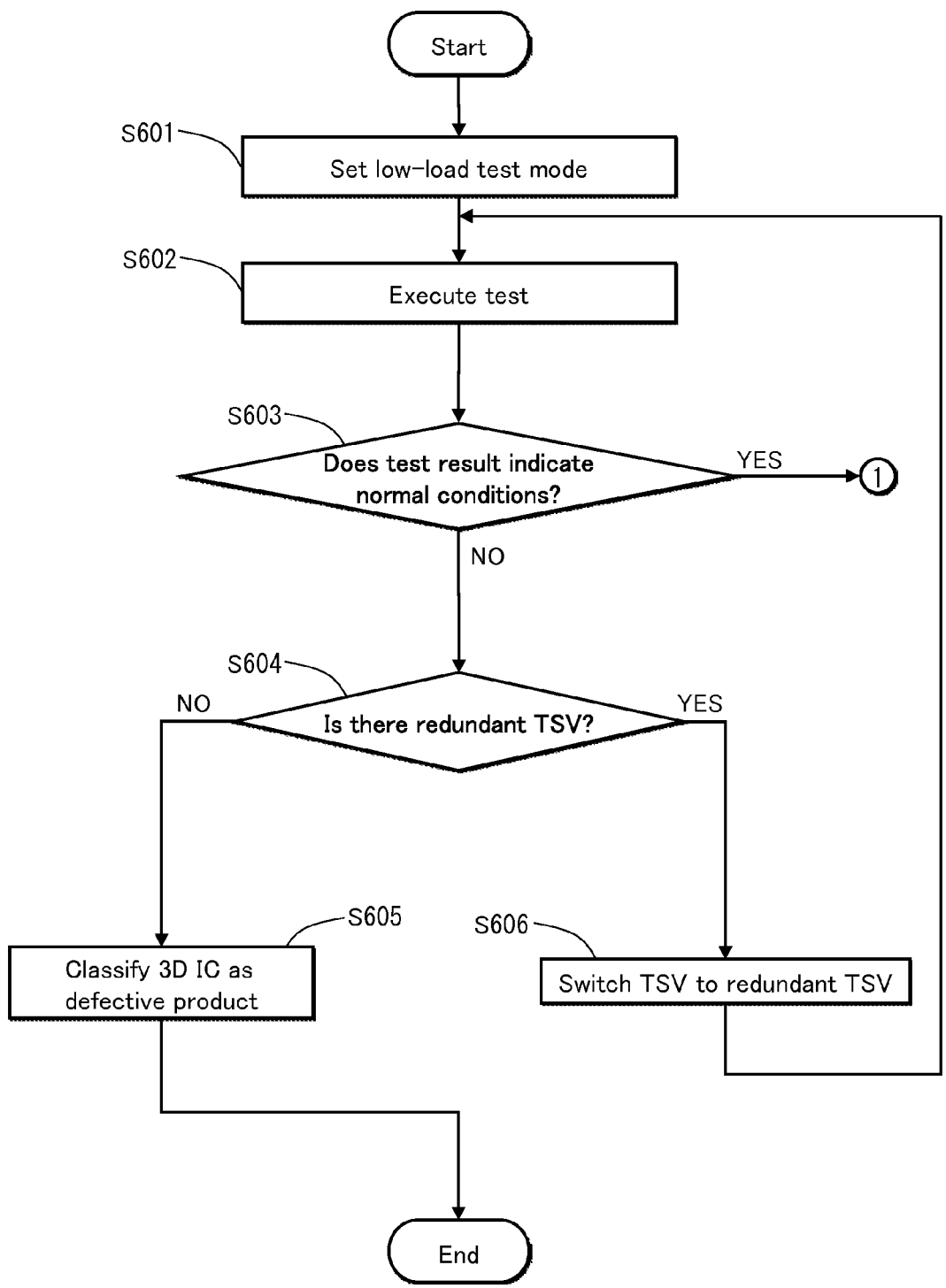
FIG. 6 is the first half of a flowchart of a test performed by a test control apparatus TCL to check whether any faulty TSVs exist or not.
Figure 7:
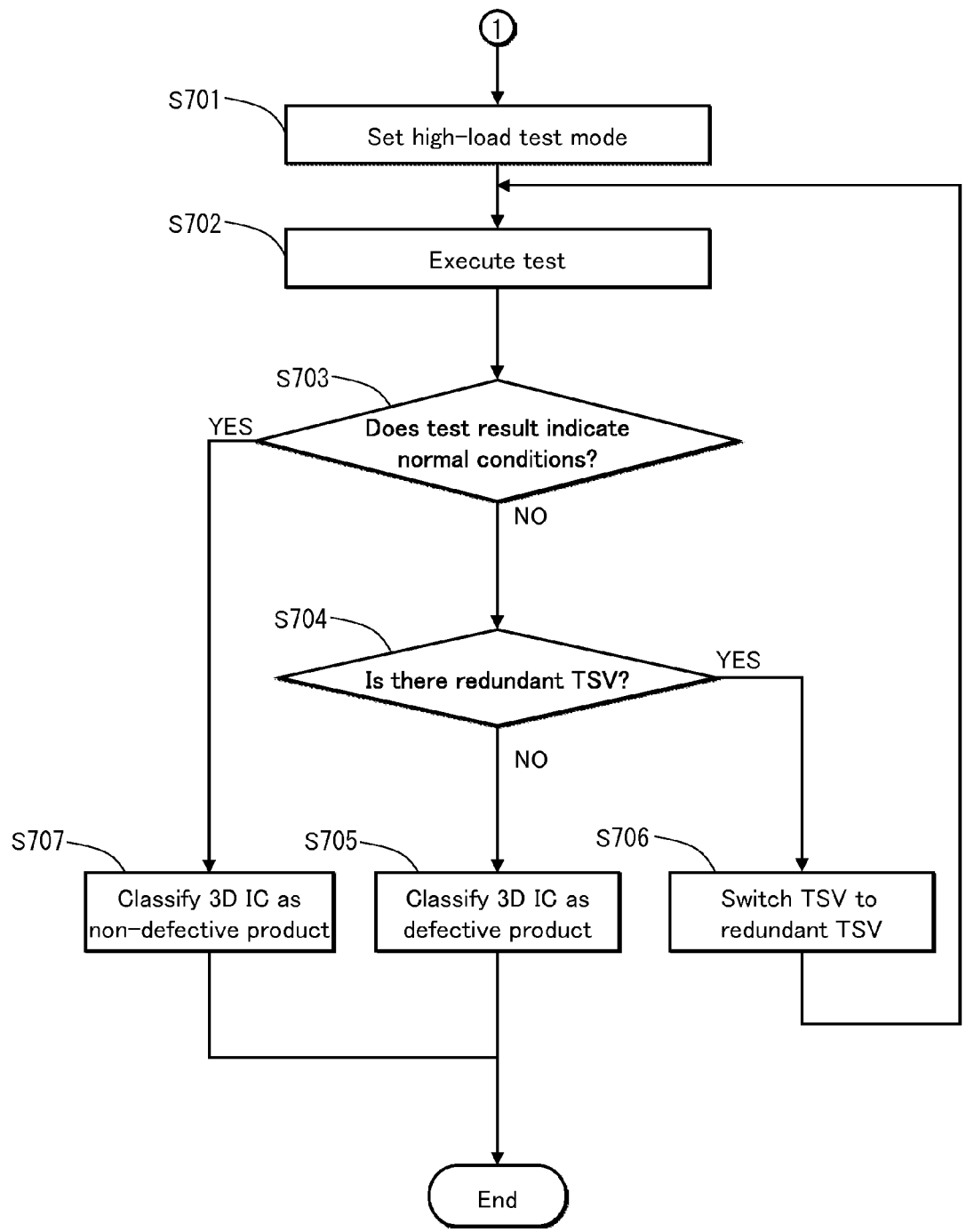
FIG. 7 is the second half of the flowchart of the test performed by the test control apparatus TCL to check whether any faulty TSVs exist or not.

FIGS. 6 and 7 are a flowchart of a test executed by the test control apparatus TCL to check whether any faulty TSVs exist or not. This test starts in a state where the test control apparatus TCL is connected between the two external pins 571 and 572 after configuring of the structure shown in FIG. 1 has been completed. This test is executed while the dummy load control circuits 504 and 564 of the chips 101 and 102 cause the cores 501-503 and 561-563 to execute their test operations. In particular, this test is executed in two cases: where a load on each of the cores 501-503 and 561-563 is light (low-load test mode), or where the load is heavy (high-load test mode). An amount of heat generated by each of the cores varies with the weights of loads thereon. The temperature of each of the chips 101 and 102 varies with the amounts of heat generated by the cores and environmental temperatures. Since the degree of warpage of each of the chips 101 and 102 depends on the temperature thereof, the degree of warpage varies with the weights of loads on the cores. Accordingly, the tests executed in both the low-load and high-load test modes enable reliable detection of faulty TSVs.

In step S601, the dummy load control circuits 504 and 564 of the chips 101 and 102 set the low-load test mode of the cores 501-503 and 561-563. To be specific, the dummy load control circuit 504 of the first chip 101 transmits a dummy command to one or more of the image decoder 501, the encrypting/decrypting circuit 502 and the media processor 503 to cause each of the cores that has received the dummy command to execute its test operation. The dummy load control circuit 564 of the second chip 102 transmits a dummy command to one or more of the stream processing circuit 561, the SATA IO 562, and the USB IO 563 to cause each of the cores that has received the dummy command to execute its test operation. The parameters indicating to which of the cores 501-503 and 561-563 and how often to transmit dummy commands are preliminarily implemented in the dummy load control circuits 504 and 564. After one of the cores 501-503 and 561-563 starts its test operation, the processing proceeds to step S602.

In step S602, while the cores 511-513 and 561-563 of the chips 101 and 102 execute their test operations, the selector control circuit 566 of the second chip 102 transmits a test bit sequence to the TSVs, and the selector control circuit 506 of the first chip 101 receives the transmitted test bit sequence from the TSVs. The test control apparatus TCL reads from the second external pin 572 the test bit sequence that is transmitted from the selector control circuit 566 of the second chip 102, and reads from the first external pin 571 the test bit sequence that has been received by the selector control circuit 506 of the first chip 101. As the test bit sequence, two bit sequences of all 1's and all 0's are used, for example. Subsequently, the processing proceeds to step S603.

In step S603, the test control apparatus TCL compares the test bit sequences read from the two external pins 571 and 572. When the two compared test bit sequences match regardless of whether all 1's or all 0's, the result of the test indicates normal conditions. In that case, the processing proceeds to step S701 shown in FIG. 7. When one or more mismatching bits are detected, the processing proceeds to step S604.

In step S604, one or more of mismatching bits have been detected. The test control apparatus TCL identifies one or more of the TSVs that have transmitted the mismatching bits from their positions. Further, the test control apparatus TCL checks whether or not the selectors can replace each of the identified TSVs with one of the redundant TSVs. When one of the identified TSVs is replaceable with none of the redundant TSVs, the processing proceeds to step S605. When all of the identified TSVs are replaceable with a subset of the redundant TSVs, the processing proceeds to step S606.

In step S605, there is none of the redundant TSVs with which replaceable is one of the TSVs that have transmitted the mismatching bits, i.e., the faulty TSVs. Accordingly, the three-dimensional integrated circuit 100 is classified as a defective product, and the test ends.

In step S606, the test control apparatus TCL causes the selector control circuits 506 and 566 to set up the selectors such that a subset of the redundant TSVs transmits a signal instead of the faulty TSVs. After that, the processing is repeated from step 602.

In step S701, the dummy load control circuits 504 and 564 switch the cores 501-503 and 561-563 to the high-load test mode. To be specific, the dummy load control circuit 504 of the first chip 101 transmits a dummy command to all of the image decoder 501, the encrypting/decrypting circuit 502 and the media processor 503 to cause all these cores to execute their test operations at the same time. The dummy load control circuit 564 of the second chip 102 transmits a dummy command to all of the stream processing circuit 561, the SATA IO 562, and the USB IO 563 to cause all these cores to execute their test operations at the same time. The parameters indicating to which of the cores 501-503 and 561-563 and how often dummy commands are to be transmitted are preliminarily implemented in the dummy load control circuits 504 and 564. After all the cores 501-503 and 561-563 start their test operations, the processing proceeds to step S702.

In step S702, while the cores 511-513 and 561-563 of the chips 101 and 102 execute their test operations, the selector control circuit 566 of the second chip 102 transmits a test bit sequence to the TSVs, and the selector control circuit 506 of the first chip 101 receives the transmitted test bit sequence from the TSVs. The test control apparatus TCL reads from the second external pin 572 the test bit sequence that is transmitted from the selector control circuit 566 of the second chip 102, and reads from the first external pin 571 the test bit sequence that has been received by the selector control circuit 506 of the first chip 101. As the test bit sequence, two bit sequences of all 1's and all 0's are used, for example. Subsequently, the processing proceeds to step S703.

In step S703, the test control apparatus TCL compares the test bit sequences read from the two external pins 571 and 572. When the two compared test bit sequences match regardless of whether all 1's or all 0's, the result of the test indicates normal conditions. In this case, the processing proceeds to step S707. When one or more mismatching bits are detected, the processing proceeds to step S704.

In step S704, one or more mismatching bits have been detected. The test control apparatus TCL identifies one or more of the TSVs that have transmitted the mismatching bits from the positions of the mismatching bits. Further, the test control apparatus TCL checks whether or not the selectors can replace each of the identified TSVs with one of the redundant TSVs. When one of the identified TSVs is replaceable with none of the redundant TSVs, the processing proceeds to step S705. When all of the identified TSVs are replaceable with a subset of the redundant TSVs, the processing proceeds to step S706.

In step S705, there is none of the redundant TSVs with which replaceable is one of the TSVs that have transmitted the mismatching bits, i.e., the faulty TSVs. Accordingly, the three-dimensional integrated circuit 100 is classified as a defective product, and the test ends.

In step S706, the test control apparatus TCL causes the selector control circuits 506 and 566 to set up the selectors such that a subset of the redundant TSVs transmits a signal instead of the faulty TSVs. After that, the processing is repeated from step 702.

In step S707, the result of the test indicates normal conditions. Accordingly, the three-dimensional integrated circuit 100 is classified as a non-defective product, and the test ends. In particular, values provided to the selectors 511-513, 551 and 552 by the selector control circuits 506 and 566, in other words, signal values specifying TSVs or bit lines to be selected by the selectors are stored in nonvolatile registers implemented on their respective chips 101 and 102. After that, the values stored in the registers are provided to the selectors each time the three-dimensional integrated circuit 100 is activated.

Alternatively, a fuse may be placed in advance on a signal line running between each of the selector control circuits 506 and 566 and one of the selectors 511-513, 551 and 552, and one or more of these fuses may be cut in step S707. The fuses may be cut by Joule heat when electric currents flow therein, or may be cut by laser heating. Cutting the fuses fixes the potentials of the signal lines, and thus the values that have been provided to the selectors are maintained to be constant. As a result, each of the selectors always selects the same TSV or the same bit line.

FIG. 8 is a table illustrating a correspondence relationship among values provided to the selectors, test bit sequences, and test results; this relationship is obtained from the tests executed by the test control apparatus TCL. In this table, each row shows values obtained from one of the tests. The order of the tests is the same as the order of rows in the table.

The first row in FIG. 8 shows values obtained from the first test. Values shown by the signal lines I and II connected to transmitter selectors, i.e., the selectors 551 and 552 of the second chip 102, are set to "second bit line dbus[1]" and "third bit line dbus[2]," respectively. On the other hand, values shown by the signal lines A, B and C connected to receiver selectors, i.e., the selectors 511, 512 and 513 of the first chip 101, are set to "TSV1," "TSV2" and "TSV3," respectively. With these settings, the selector control circuit 566 of the second chip 102 transmits a test bit sequence "11111," and then the selector control circuit 506 of the first chip 101 receives a test bit sequence "11111." Since these two test bit sequences match, the result of the test indicates that conditions are "normal."

The second row in FIG. 8 shows values obtained from the second test. In the second test, values provided to the transmitter selectors 551 and 552 are "second bit line dbus[1]" and "third bit line dbus[2]," respectively, and values provided to the receiver selectors 511, 512 and 513 are "TSV1," "TSV2" and "TSV3," respectively, like in the first test. With these settings, the selector control circuit 566 of the second chip 102 transmits a test bit sequence "00000," and then the selector control circuit 506 of the first chip 101 receives a test bit sequence "00100." Since the third bits of the two test bit sequences do not match, the result of the test indicates "the TSV2 is faulty."

The third row in FIG. 8 shows values obtained from the third test. The third test differs from the second test in that the value provided to the second selector 512 has been changed from "TSV2" to "RTSV1." With these settings, the selector control circuit 566 of the second chip 102 transmits a test bit sequence "11111," and then the selector control circuit 506 of the first chip 101 receives a test bit sequence "11111." Since these two test bit sequences match, the result of the test indicates "normal."

The fourth row in FIG. 8 shows values obtained from the fourth test. In the fourth test, values provided to the transmitter selectors 551 and 552 are "second bit line dbus[1]" and "third bit line dbus[2]," respectively, and values provided to the receiver selectors 511, 512 and 513 are "TSV1," "RTSV1" and "TSV3," respectively, like in the third test. With these settings, the selector control circuit 566 of the second chip 102 transmits a test bit sequence "00000," and then the selector control circuit 506 of the first chip 101 receives a test bit sequence "00100." Since the third bits of the two test bit sequences do not match, the result of the test indicates "the RTSV2 is faulty."

The fifth row in FIG. 8 shows values obtained from the fifth test. The fifth test differs from the fourth test in that the value provided to the fourth selector 551 has been changed from "second bit line dbus[1]" to "third bit line dbus[2]" and the value provided to the second selector 512 has been changed from "RTSV1" to "RTSV2." With these settings, the selector control circuit 566 of the second chip 102 transmits a test bit sequence "11111," and then the selector control circuit 506 of the first chip 101 receives a test bit sequence "11111." Since these two test bit sequences match, the result of the test indicates "normal."

The sixth row in FIG. 8 shows values obtained from the sixth test. In the sixth test, values provided to the transmitter selectors 551 and 552 are both "third bit line dbus[2]," and values provided to the receiver selectors 511, 512 and 513 are "TSV1," "RTSV2" and "TSV3," respectively, like in the fifth test. With these settings, the selector control circuit 566 of the second chip 102 transmits a test bit sequence "00000," and then the selector control circuit 506 of the first chip 101 receives a test bit sequence "00000." Since these two test bit sequences match, the result of the test indicates "normal."

As shown in FIG. 8, each time a faulty TSV is detected from the result of a test, the faulty TSV is replaced with a redundant TSV and a test is repeated. When the results of the tests using the two types of test bit sequences "11111" and "00000" both indicate normal conditions, the three-dimensional integrated circuit 100 is classified as a non-defective product, and if not, it is as a defective product.

Like the TSV1, TSV2 and TSV3 that are replaceable with the RTSV1 or RTSV2 shown in FIG. 5, the TSVs that are replaceable with the redundant TSVs, i.e., the first TSVs 401, are located in the central region 400 of the first chip 101, as shown in FIG. 4. In the central region 400, the distances between the chips are larger than the threshold value TH as shown in FIG. 3A, and accordingly the first TSVs 401 are more vulnerable to faults than the second TSVs 402. Therefore, in the three-dimensional integrated circuit 100 according to Embodiment 1 of the present invention, only TSVs vulnerable to faults are replaceable with the redundant TSVs. This structure limits the number of selectors, the area of wires connecting the TSVs to the selectors, and the area of wires connecting the selectors to the control circuit thereof, while maintaining a high yield of three-dimensional integrated circuits. This results in reduction of the adverse effects that the selectors and the above-listed wires give to power consumption of the chips 101 and 102 and operations of the cores. Also, the manufacturing costs of the chips 101 and 102 are further reduced.

Note that in the three-dimensional integrated circuit 100 according to Embodiment 1 of the present invention, a test bit sequence is transmitted from the selector control circuit 566 of the second chip 102 to the selector control circuit 506 of the first chip 101. Conversely, a test bit sequence may be transmitted from the selector control circuit 506 of the first chip 101 to the selector control circuit 566 of the second chip 102. In that case, the transmitter selectors 511-513 shown in FIG. 5 are located on the second chip 102, and the receiver selectors 551 and 552 are located on the first chip 101.

The three-dimensional integrated circuit 100 according to Embodiment 1 of the present invention uses test bit sequences of all 1's and all 0's. Alternatively, a bit sequence of alternate 1's and 0's such as "1010 . . . " may be used as a test bit sequence. Further, a test bit sequence may result from consideration of a relationship between positions of TSVs and effects of crosstalk noise caused by coupling of the TSVs.

The three-dimensional integrated circuit 100 according to Embodiment 1 of the present invention can detect faulty TSVs from whether a test bit sequence changes or not during transmission from one of the chips 101 and 102 to the other. Alternatively, the three-dimensional integrated circuit 100 may detect faulty TSVs from a delay or change in waveform of a signal that occurs while the signal is transmitted from one of the chips 101 and 102 to the other.

Embodiment 2

A three-dimensional integrated circuit according to Embodiment 2 of the present invention differs from that according to Embodiment 1 in arrangement of TSVs. Other components are the same as those in Embodiment 1. Accordingly, details of the other components can be found in the description of Embodiment 1.

Figure 9A:
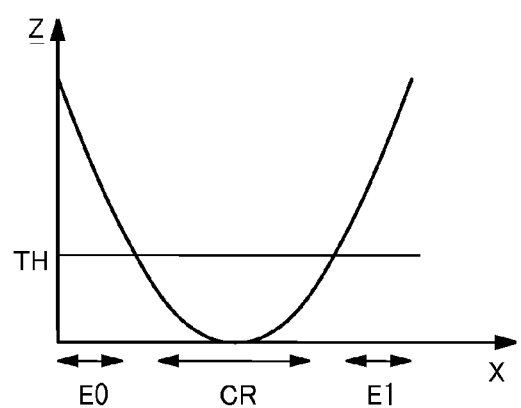
FIG. 9A is a graph showing the distances between the first chip 101 and the second chip 102 according to Embodiment 2 of the present invention varying with longitudinal location caused by warpage of the chips.

As shown in FIG. 2, the substrate 201 of the first chip 101 is thin, and accordingly the first chip 101 warps. The same is true for the second chip 102. In Embodiment 1, the distances between the chips due to their warpage increase greater in their central region CR than in their peripheral regions E0 and E1, as shown in FIG. 3A. Conversely, the distances between the chips may be greater in the peripheral regions E0 and E1 than in the central region CR. FIG. 9A is a graph showing the distances between the chips varying with longitudinal location caused by the warpage of the first chip 101 and the second chip 102. The X axis is oriented in the longitudinal direction, like the X axis shown in FIG. 1. The Z axis is oriented in the normal direction of the surfaces of the chips 101 and 102, like the Z axis shown in FIG. 1. In particular, the positive direction of the Z axis points away from the interposer 103, as shown in FIG. 1. With reference to FIG. 9A, the distances between the chips in the central region CR are smaller than the threshold value TH, while the distances between the chips in the peripheral regions E0 and E1 are greater than the threshold value TH. In that case, TSVs are more vulnerable to faults in the peripheral regions E0 and E1 than in the central region CR.

Figure 9B:
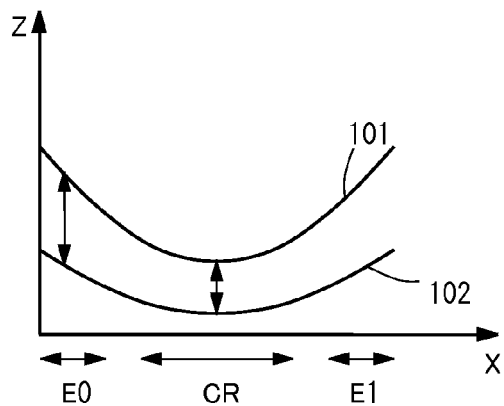
FIG. 9B is a schematic view showing one example of actual warpage of the first chip 101 and the second chip 102.

FIG. 9B is a schematic view showing one example of actual warpage of the first chip 101 and the second chip 102. The X and Z axes in FIG. 9B are the same as the axes in FIG. 9A. With reference to FIG. 9B, the first chip 101 and the second chip 102 warp such that their peripheral regions E0 and E1 are farther from the interposer 103 than their central region CR. The curvature of the warpage of the first chip 101 is greater than that of the second chip 102. As a result, the distances between the first chip 101 and the second chip 102 vary as shown in the graph of FIG. 9A, and are specifically greater in the peripheral regions E0 and E1 than in the central region CR. Meanwhile, a faulty TSV is more likely to appear with increase of the distances between the first chip 101 and the second chip 102. Accordingly, in the case shown in FIG. 9B, a faulty TSV is more likely to appear in the peripheral regions E0 and E1 than in the central region CR.

Figure 9C:
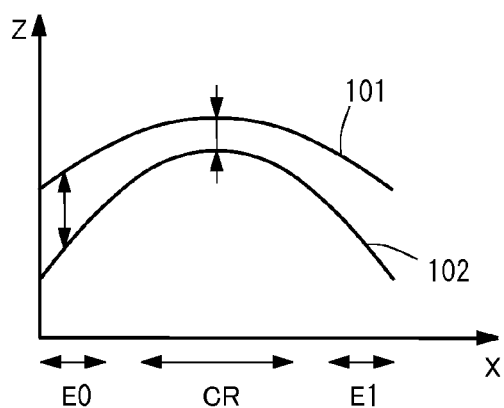
FIG. 9C is a schematic view showing another example of actual warpage of the first chip 101 and the second chip 102.

While the distances between the chips 101 and 102 vary as shown in FIG. 9A, the direction of warpage of the chips may be opposite to the direction of the warpage shown in FIG. 9B. FIG. 9C is a schematic view showing another example of actual warpage of the first chip 101 and the second chip 102. The X and Z axes in FIG. 9C are the same as the axes in FIG. 9A. With reference to FIG. 9C, the first chip 101 and the second chip 102 warp such that their central region CR is farther from the interposer 103 than their peripheral regions E0 and E1. However, the curvature of the warpage of the second chip 102 is greater than that of the first chip 101. As a result, the distances between the first chip 101 and the second chip 102 vary as shown in the graph of FIG. 9A, and are specifically greater in the peripheral regions E0 and E1 than in the central region CR. Accordingly, also in the case shown in FIG. 9C, a faulty TSV is more likely to appear in the peripheral regions E0 and E1 than in the central region CR.

Figure 9D:
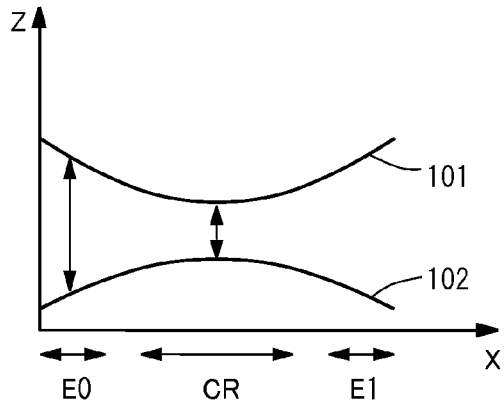
FIG. 9D is a schematic view showing yet another example of actual warpage of the first chip 101 and the second chip 102.

FIG. 9D is a schematic view showing yet another example of actual warpage of the first chip 101 and the second chip 102. The X and Z axes in FIG. 9D are the same as the axes in FIG. 9A. With reference to FIG. 9D, the first chip 101 warps such that its peripheral regions E0 and E1 are farther from the interposer 103 than its central region CR, but the second chip 102 warps such that its central region CR is farther from the interposer 103 than its peripheral regions E0 and E1. As a result, the distances between the first chip 101 and the second chip 102 vary as shown in the graph of FIG. 9A, and are specifically greater in their peripheral regions E0 and E1 than in their central region CR. Accordingly, even in the case shown in FIG. 9D, a faulty TSV is more likely to appear in the peripheral regions E0 and E1 than in the central region CR.

Figure 10:
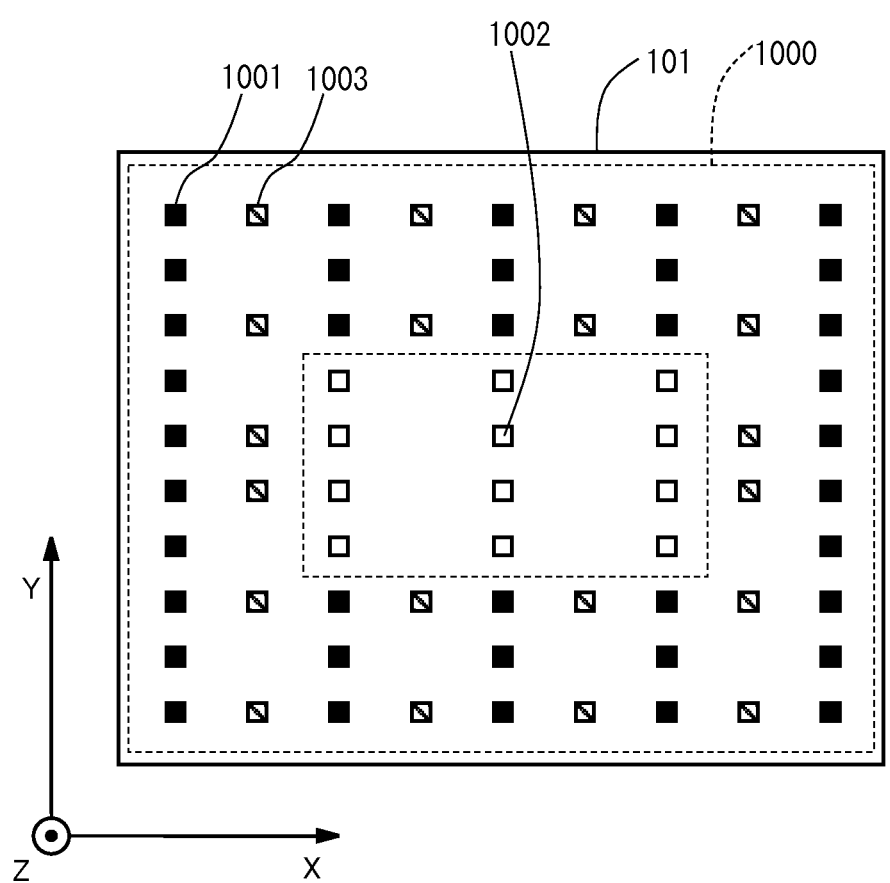
FIG. 10 is a plan view schematically showing an arrangement of TSVs on the first chip 101 according to Embodiment 2 of the present invention.

FIG. 10 is a plan view schematically showing an arrangement of TSVs 1001, 1002 and 1003 on the first chip 101. The diameters of the TSVs 1001, 1002 and 1003 are exaggerated, like equivalents shown in FIG. 4. With reference to FIG. 10, the TSVs are classified into the first TSVs 1001, the second TSVs 1002, and the redundant TSVs 1003. The first TSVs 1001 and the second TSVs 1002 are located at intervals of predetermined lengths, e.g., several hundred μm, in both longitudinal and transverse directions of the first chip 101 (the X- and Y-axis directions in FIG. 10, respectively). In FIG. 10, the first TSVs 1001 are shown as black rectangles, and arranged in a peripheral region 1000 of the first chip 101. In FIG. 10, the second TSVs 1002 are shown as white rectangles, and arranged in the central region surrounded by the peripheral region 1000. In FIG. 10, the redundant TSVs 1003 are shown as hatched rectangles, and arranged among the first TSVs 1001. While not shown in FIG. 10, various cores and selectors are implemented in regions among the TSVs 1001-1003. The selectors each select either one of the first TSVs 1001 or one of the redundant TSVs 1003, and electrically connect the selected TSV to the wiring layer 101A of the first chip 101. This allows the cores of the first chip 101 to be electrically connected to the cores of the second chip 102 through the first TSVs 1001 or the redundant TSVs 1003. In contrast, the second TSVs 1002 electrically connect the wiring layer 101A of the first chip 101 directly to the wiring layer 101B of the second chip 102.

When one of the first TSVs 1001 is faulty, one of the selectors that is connected to the faulty first TSV 1001 connects one of the redundant TSVs 1003 to the wiring layers 101A and 102A of the chips instead of the faulty first TSV 1001. This structure maintains excellent electrical connection between the first chip 101 and the second chip 102.

The peripheral region 1000 in which the first TSVs 1001 are arranged as shown in FIG. 10 is assigned to the region where the distances between the chips exceed the threshold value TH as shown in FIG. 9A. The threshold value TH equals the distances between the chips in the case where the probability of appearance of a faulty TSV due to the warpage of the chips reaches a predetermined value. In the peripheral region 1000, the distances between the chips exceed the threshold value TH, and accordingly the probability of appearance of a faulty TSV exceeds the predetermined value. Thus, the placement of the first TSVs 1001 is limited within the range in which a faulty TSV is likely to appear due to the large distances between the chips. This structure limits the number of the selectors, the areas of wires connecting the first TSVs 1001 to the selectors, and the areas of wires connecting the selectors to the control circuit thereof, while maintaining a high yield of three-dimensional integrated circuits. This results in reduction of the adverse effects that the selectors and the above-listed wires give to power consumption of the chips 101 and 102 and operations of the cores. Also, the manufacturing costs of the chips 101 and 102 are further reduced.

<Modification>

(A) In both FIGS. 4 and 10, the redundant TSVs 403 and 1003 are arranged among the first TSVs 401 and 1001. This arrangement allows shorter lengths of wires between the first TSVs 401, 1001 and the redundant TSVs 403, 1003. Alternatively, the redundant TSVs may be arranged in regions where the distances between the first chip 101 and the second chip 102 are smaller than those in the region where the first TSVs 401 and 1001 are arranged (the central region 400 shown in FIG. 4, and the peripheral region 1000 shown in FIG. 10).

Figure 11:
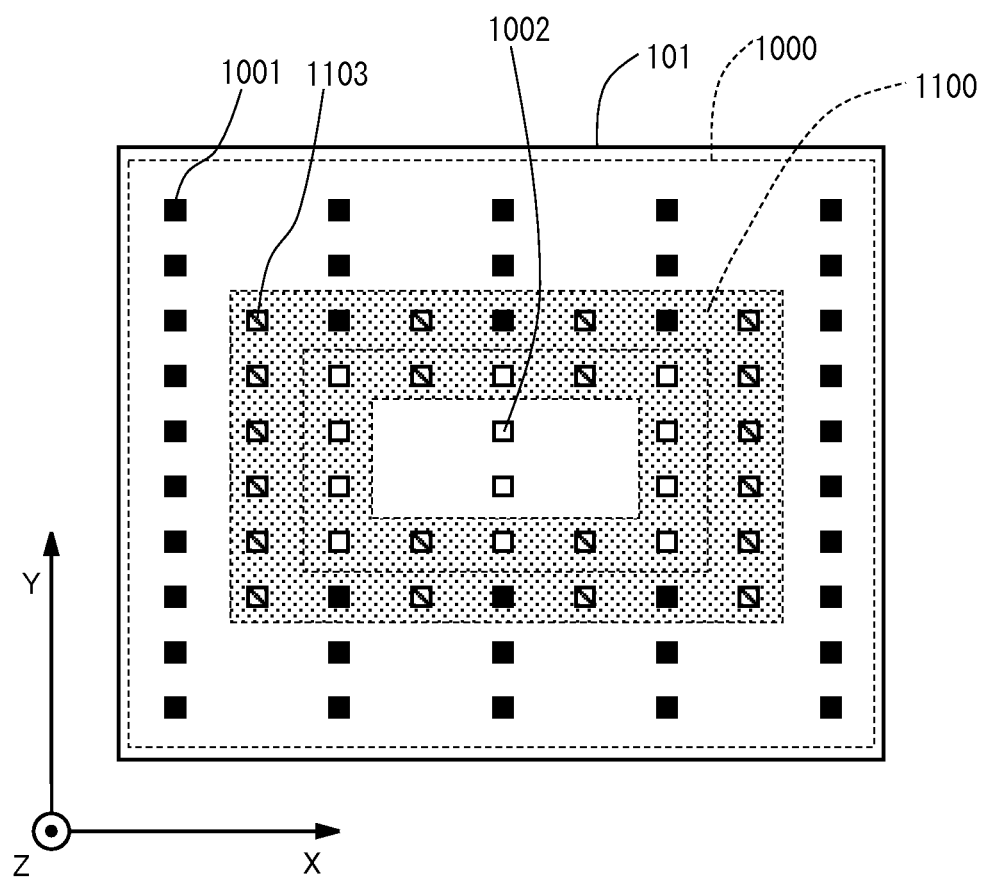
FIG. 11 is a plan view schematically showing a modification of the arrangement of the TSVs on the first chip 101 according to Embodiment 2 of the present invention.

FIG. 11 is a plan view schematically showing a modification of the arrangement of the TSVs 1001, 1002 and 1103 on the first chip 101. The diameters of the TSVs 1001, 1002 and 1103 are exaggerated, like those shown in FIG. 10. With reference to FIG. 11, the locations of the redundant TSVs 1103 differ from those shown in FIG. 10. The redundant TSVs 1103 are located in a boundary region 1100 (the region indicated by a plurality of dots in FIG. 11) between the peripheral region 1000 in which the first TSVs 1001 are located and the central region in which the second TSVs 1002 are located. In the boundary region 1000, the redundant TSVs 1103 are arranged among the first TSVs 1001 and the second TSVs 1002. While not shown in FIG. 11, various cores and selectors are implemented in regions among the TSVs 1001, 1002 and 1103. The selectors each select either one of the first TSVs 1001 or one of the redundant TSVs 1103, and electrically connect the selected TSV to the wiring layer 101A of the first chip 101. This allows the cores of the first chip 101 to be electrically connected to the cores of the second chip 102 through the first TSVs 1001 or the redundant TSVs 1103.

As shown in FIG. 11, the redundant TSVs 1103 are located in the region of the chips surrounded by the region where the first TSVs 1001 are located. Accordingly, as is clear from FIG. 9A, in the region where the redundant TSVs 1103 are located, the distances between the chips are smaller than in the region where the first TSVs 1001 are located. Thus, the redundant TSVs 1103 are less vulnerable to faults than the first TSVs 1001 in general. Consequently, when one of the first TSVs 1001 has a fault, replacing the faulty first TSV 1001 with one of the redundant TSVs 1103 enables connection between the first chip 101 and the second chip 102 to be more reliably restored.

All TSVs may be concentrated in the region where the distances between the chips are so small that a faulty TSV is unlikely to appear. Note that, in that case, the lengths of wires connecting the TSVs and the cores increase, and accordingly power consumption and areas of the wires increase. Therefore, high concentration of only redundant TSVs in the region where the distances between the chips are small to avoid faulty connections, as shown in FIG. 11, can suppress increases of power consumption and areas of the wires more effectively than high concentration of all the TSVs in the region.

In FIG. 11, all the redundant TSVs are included in the region where the distances between the chips are relatively small. Alternatively, while redundant TSVs may be distributed throughout the chips, the TSVs arranged in the region where the distances between the chips are relatively small may have a higher proportion of redundant TSVs.

(B) In FIGS. 4 and 10, the first TSVs and the second TSVs are separately concentrated in either the central or peripheral region of the chip. Alternatively, the first TSVs and the second TSVs may be mixed throughout the chip. Here, the arrangement of TSVs is designed so that the TSVs arranged in the region where the distances between the chips are relatively large have a high proportion of the first TSVs. For example, in the case where the distances between the chips are greater in the central region than in the peripheral regions as shown in FIG. 3A, the arrangement of TSVs is designed so that TSVs arranged in the central region have a higher proportion of the first TSVs and those arranged in the peripheral regions have a lower proportion thereof. In the case where the distances between the chips vary as shown in FIG. 9A, the proportions of the first TSVs are set reversely. These arrangements also limit the number of the selectors, the areas of wires connecting the TSVs to the selectors, and the areas of wires connecting the selectors to the control circuit thereof, while maintaining a high yield of three-dimensional integrated circuits, in contrast to the case where all TSVs are replaceable with redundant TSVs. This results in reduction of the adverse effects that the selectors and the above-listed wires give to power consumption of the chips 101 and 102 and operations of the cores. Also, the manufacturing costs of the chips 101 and 102 are further reduced.

(C) In Embodiments 1 and 2 described above, the arrangement of the TSVs in the first chip 101 is designed depending on the distances between the two chips 101 and 102. That is, in the case where the rewiring member located below the chip 101 is the other chip 102, the arrangement of TSVs on the upper chip 101 is designed. Similarly, the arrangement of TSVs on the second chip 102 may be designed depending on the distances between the second chip 102 and the interposer 103. That is, the arrangement of TSVs may be designed so that TSVs arranged in the region where the distances between the second chip 102 and the interposer 103 are relatively large have a higher proportion of the first TSVs. In this way, even when the rewiring member located below the chip is the interposer, it is possible to limit the area of a redundant circuit on each of the chip and the interposer, while maintaining a high yield of three-dimensional integrated circuits.

Figure 12:
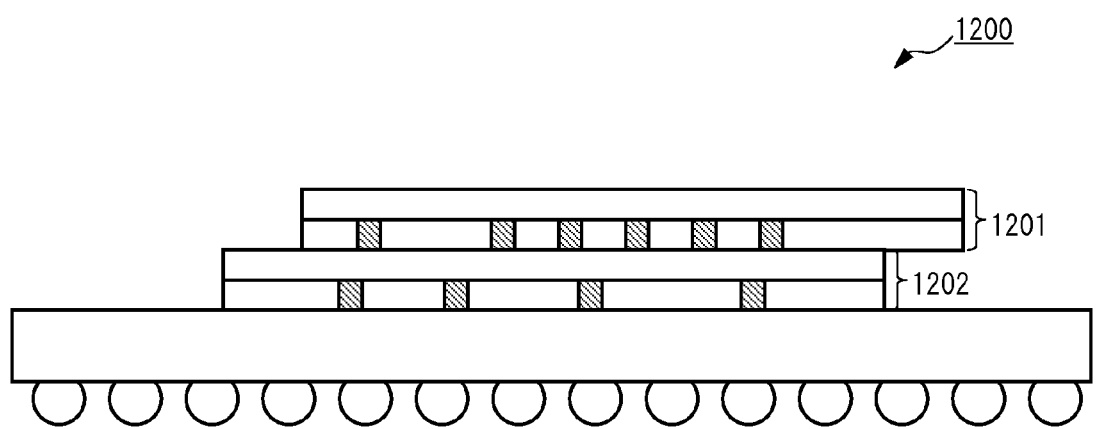
FIG. 12 is a cross-sectional view showing a three-dimensional integrated circuit 1200 including two chips overlapping so that the center of the upper chip is not located directly above the center of the lower chip.

(D) In FIG. 1, the two chips 101 and 102 are layered such that each edge of the first chip 101 is located directly above a corresponding edge of the second chip 102. Alternatively, the two chips may be layered such that the center of one chip is not located directly above the center of the other chip. FIG. 12 is a cross-sectional view showing a three-dimensional integrated circuit 1200 in that case. With reference to FIG. 12, a first chip 1201 and a second chip 1202 are the same in shape and size, like the chips 101 and 102 shown in FIG. 1. However, unlike in FIG. 1, the center of the first chip 1201 is not located directly above the center of the second chip 1202. In this case, even if the first chip 1201 and the second chip 1202 warp to be exactly the same shape, the distances between the chips vary with location. Therefore, the arrangement of TSVs is designed so that TSVs arranged in the region where the distances between the chips are relatively large have a higher proportion of the first TSVs. This structure can limit the area of a redundant circuit, while maintaining a high yield of three-dimensional integrated circuits.

Figure 13:
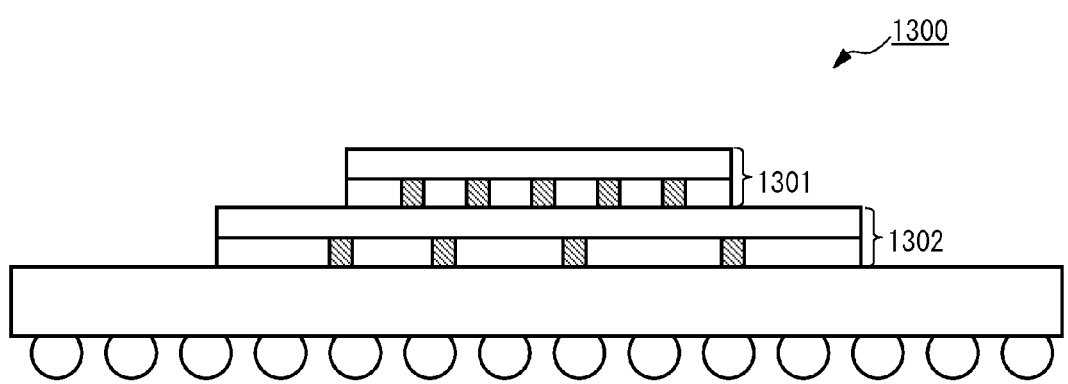
FIG. 13 is a cross-sectional view showing one example 1300 of a three-dimensional integrated circuit including a lower chip and an upper chip smaller than the lower chip.

(E) In FIG. 1, the first chip 101 and the second chip 102 are the same in shape and size. Alternatively, the two chips may be different in shape and size. FIG. 13 is a cross-sectional view showing one example 1300 of a three-dimensional integrated circuit including a lower chip and an upper chip smaller than the lower chip. With reference to FIG. 13, two chips 1301 and 1302 are layered such that the center of the upper chip 1301 is located directly above the center of the lower chip 1302. In that case, if curvatures of warpage are different between the upper chip 1301 and the lower chip 1302, the distances between the upper chip 1301 and the lower chip 1302 are different between the central and peripheral regions of the upper chip 1301. Accordingly, the arrangement of TSVs on the upper chip 1301 is designed so that TSVs arranged in one of the central and peripheral regions have a higher proportion of the first TSVs than in the other. This structure can limit the area of a redundant circuit, while maintaining a high yield of three-dimensional integrated circuits.

Figure 14:
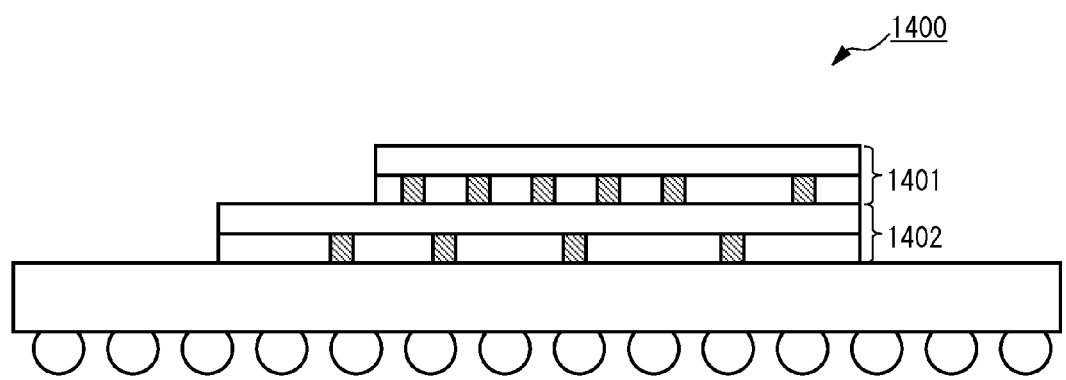
FIG. 14 is a cross-sectional view showing another example 1400 of the three-dimensional integrated circuit including a lower chip and an upper chip smaller than the lower chip.

FIG. 14 is a cross-sectional view showing another example 1400 of a three-dimensional integrated circuit including a lower chip and an upper chip smaller than the lower chip. With reference to FIG. 14, two chips 1401 and 1402 are layered such that one edge of the upper chip 1401 is located directly above one edge of the lower chip 1402. In this case, the center of the upper chip 1401 is not located directly above the center of the lower chip 1402, and accordingly, even if the two chips 1401 and 1402 have the same curvature of warpage, the distances between the two chips 1301 and 1302 vary with location. Therefore, the arrangement of TSVs is designed so that TSVs arranged in a region have a proportion of the first TSVs depending on the distances between the chips in the region. This structure can limit the area of a redundant circuit, while maintaining a high yield of three-dimensional integrated circuits.

Figure 15:
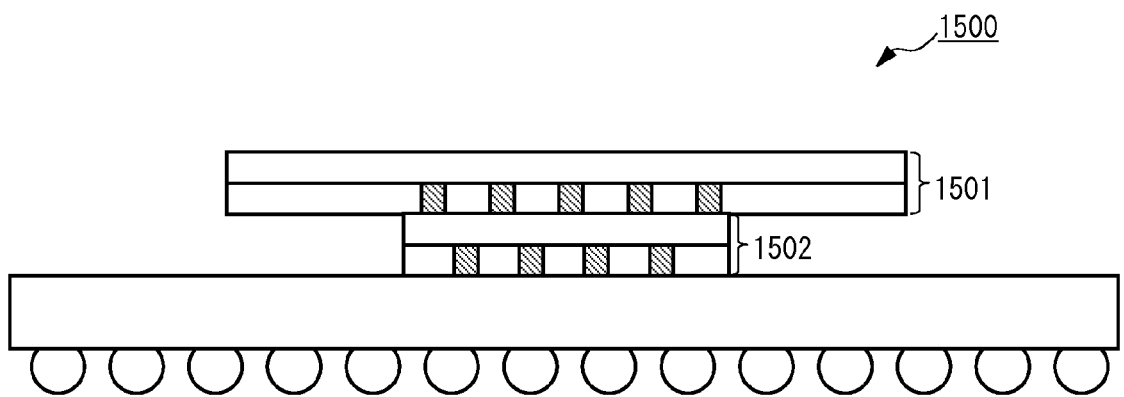
FIG. 15 is a cross-sectional view showing a three-dimensional integrated circuit 1500 including a lower chip and an upper chip larger than the lower chip.

FIG. 15 is a cross-sectional view showing a three-dimensional integrated circuit 1500 including a lower chip and an upper chip larger than the lower chip. With reference to FIG. 15, the two chips 1501 and 1502 are layered such that the upper chip 1501 covers the entirety of the lower chip 1502. In this case, the distances between the two chips vary with location. Therefore, the arrangement of TSVs is designed so that TSVs arranged in a region have a proportion of the first TSVs depending on the distances between the chips in the region. This structure can limit the area of a redundant circuit, while maintaining a high yield of three-dimensional integrated circuits.

Figure 16:
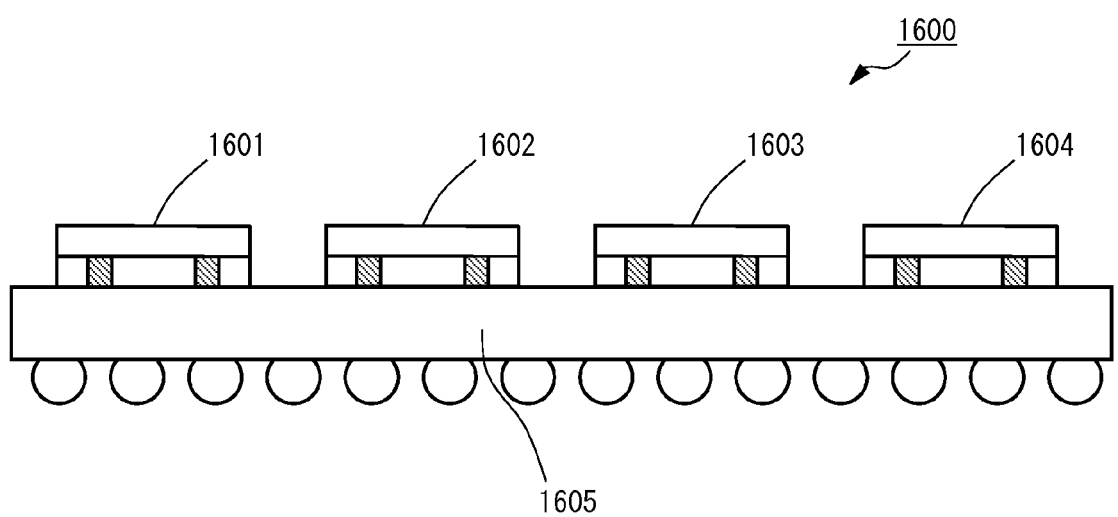
FIG. 16 is a cross-sectional view showing an integrated circuit 1600 including an interposer and a plurality of chips separately disposed on the interposer.

(F) In FIG. 1, the two chips 101 and 102 are layered one on top of the other at the same location on the interposer 103. Alternatively, a plurality of chips may be separately disposed on the interposer. FIG. 16 is a cross-sectional view of such an integrated circuit 1600. Four chips 1601-1604 are the same in shape and size. The interposer 1605 and the chips 1601-1604 are generally different in direction and degree of warpage. Accordingly, the distances between each of the chips 1601-1604 and the interposer 1605 vary with location. Therefore, the arrangement of TSVs is designed so that all TSVs arranged in a region have a proportion of the first TSVs depending on the distances between the chips 1601-1604 and the interposer 1605 in the region. This structure can limit the area of a redundant circuit, while maintaining a high yield of integrated circuits.

Figure 17:
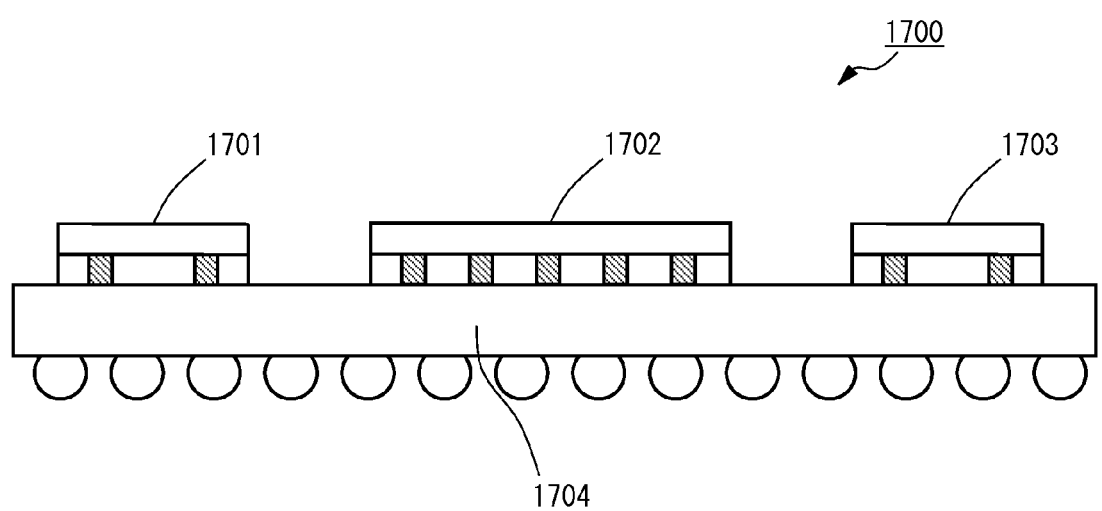
FIG. 17 is a cross-sectional view showing an integrated circuit 1700 including chips having different shapes or sizes.

In contrast to FIG. 16, chips may have different shapes or sizes. FIG. 17 is a cross-sectional view of such an integrated circuit 1700. A second chip 1702 is greater in size than a first chip 1701 and a third chip 1703, and located in the central region of an interposer 1704. Due to warpage of the chips 1701-1703 and the interposer 1704, the distances between each of the chips 1701-1703 and the interposer 1704 vary with location. Generally, the distances vary most widely at the second chip 1702, which has the largest size among the chips. Therefore, only in the second chip 1702, the arrangement of TSVs may be designed so that TSVs arranged in a region have a proportion of the first TSVs depending on the distances between the chip and the interposer 1704. This structure can more effectively limit the area of a redundant circuit, while maintaining a high yield of integrated circuits.

(G) The three-dimensional integrated circuits according to Embodiments 1 and 2 of the present invention use TSVs as connecting members. Alternatively, the connecting member may be micro bumps. In that case, the first chip 101 includes micro bumps on the surface of the substrate 201 that is located across the substrate 201 from the wiring layer 101A. Each micro bump is designed to have a diameter larger than the thickness of the substrate 201, and accordingly the micro bumps are directly connected to the wiring layer 101A through holes of the substrate 201. Alternatively, the micro bumps and the wiring layer 101A may be connected by wires that are formed along the surface of the substrate 201. When the distances between the chips are larger in their central region than in their peripheral regions as shown in FIG. 3A, the micro bumps that are replaceable with redundant micro bumps are arranged in the central region. Conversely, when the distances between the chips are larger in the peripheral regions than in the central region as shown in FIG. 9A, the micro bumps that are replaceable with redundant micro bumps are arranged in the peripheral regions.

INDUSTRIAL APPLICABILITY

The present invention relates to the three-dimensional layering technologies for integrated circuits, and as described above, changes the arrangement of connecting members that are replaceable with redundant connecting members depending on the distances between chips. As such, the present invention clearly has industrial applicability.

REFERENCE SIGNS LIST 101 first chip
400 central region of chip
401 first TSV
402 second TSV
403 redundant TSV

The invention claimed is:

1. A three-dimensional integrated circuit comprising:
a rewiring member that is plate-like;
a chip layered on the rewiring member;
a plurality of connecting members and a plurality of redundant connecting members both arranged in the chip and configured to electrically connect the rewiring member and the chip; and
first and second redundant circuits embedded in the rewiring member and the chip, respectively, and each configured to, when one of the plurality of connecting members is faulty, cause one of the plurality of redundant connecting members to transmit a signal between the rewiring member and the chip, instead of the faulty one of the plurality of connecting members, wherein
the plurality of connecting members include first and second subsets that are arranged in first and second regions, respectively,
a distance between the rewiring member and the chip exceeds a predetermined threshold value in the first region in contrast to the second region, and
the first subset has a higher proportion of connecting members that the first and second redundant circuits can replace with a subset of the plurality of redundant connecting members than the second subset.

2. The three-dimensional integrated circuit of claim 1, wherein
the rewiring member is another chip.

3. The three-dimensional integrated circuit of claim 1, wherein
the rewiring member is an interposer.

4. The three-dimensional integrated circuit of claim 1, wherein
the plurality of connecting members and the plurality of redundant connecting members are through-silicon vias.

5. The three-dimensional integrated circuit of claim 1, wherein
the plurality of connecting members and the plurality of redundant connecting members are micro bumps.

6. The three-dimensional integrated circuit of claim 1, wherein
the rewiring member includes a first bus that electrically connects among internal circuits of the rewiring member,
the chip includes a second bus that electrically connects among internal circuits of the chip,
the first redundant circuit includes a first selector embedded in the rewiring member and configured to select one of the plurality of connecting members and the plurality of redundant connecting members to connect the selected connecting member to the first bus, and
the second redundant circuit includes a second selector embedded in the chip and configured to select one of bit lines included in the second bus to connect the selected bit line to the one of the redundant connecting members.

7. The three-dimensional integrated circuit of claim 1, wherein
the plurality of connecting members further include third and fourth subset that are arranged in third and fourth region, respectively,
the third subset has a lower proportion of connecting members replaceable with a subset of the plurality of redundant connecting members than the fourth subset, and
the ratio of redundant connecting members to connecting members is higher in the third region than in the fourth region.

* * * * *